United States Patent
Kang

(10) Patent No.: US 7,042,784 B2
(45) Date of Patent: May 9, 2006

(54) NONVOLATILE FERROELECTRIC MEMORY DEVICE WITH SPLIT WORD LINES

(75) Inventor: Hee-Bok Kang, Ichon-shi (KR)

(73) Assignee: Hynix Semiconductor Inc., Ichon-Shi (KR)

( * ) Notice: Subject to any disclaimer, the term of this patent is extended or adjusted under 35 U.S.C. 154(b) by 0 days.

(21) Appl. No.: 11/167,159

(22) Filed: Jun. 28, 2005

(65) Prior Publication Data

US 2005/0231998 A1    Oct. 20, 2005

Related U.S. Application Data

(62) Division of application No. 10/946,295, filed on Sep. 22, 2004, now Pat. No. 6,925,030.

(30) Foreign Application Priority Data

Aug. 8, 2002    (KR) ............................. 2002-46789

(51) Int. Cl.
*G11C 7/02* (2006.01)
(52) U.S. Cl. ..................... 365/210; 365/63; 365/145
(58) Field of Classification Search ............... 365/210, 365/63, 145
See application file for complete search history.

(56) References Cited

U.S. PATENT DOCUMENTS 6,654,301 B1 * 11/2003 Chehrazi et al. ............ 365/204
6,865,099 B1 * 3/2005 Tran et al. .................. 365/210
6,888,735 B1 * 5/2005 Nishihara .................... 365/145

OTHER PUBLICATIONS

2002 IEEE International Solid-State Circuits Conference; Visual Supplement; Feb. 2002.

* cited by examiner

*Primary Examiner*—Huan Hoang
(74) *Attorney, Agent, or Firm*—Mayer, Brown, Rowe & Maw LLP

(57) ABSTRACT

The present invention relates to a memory device; and, more particularly, to a cell array of a nonvolatile ferroelectric memory device and an apparatus and a method for driving such a cell array. The nonvolatile ferroelectric memory device according to the present invention includes: a cell array region having first and second cell array blocks which are adjacent to each other and independently operate; a first drive region being adjacent to the first cell array block in the cell array region in order to drive first split words line which operate as plate lines of the first cell array block and word lines of the second cell array block; and a second drive region being adjacent to the second cell array block in the cell array region in order to drive first split word lines which operate as plate lines of the second cell array block and word lines of the first cell array block, wherein each of the first and second drive regions includes a plurality of split word line drivers and wherein each of the split word line drivers is connected to the plate lines of the first and second cell array blocks correspondent thereto.

2 Claims, 21 Drawing Sheets

NONVOLATILE FERROELECTRIC MEMORY DEVICE WITH SPLIT WORD LINES

CROSS REFERENCE TO RELATED APPLICATION

This application is a divisional of U.S. Ser. No. 10/946,295, filed on Sep. 22, 2004 now U.S. Pat. No. 6,925,030. This application, in its entirety, is incorporated herein by reference.

FIELD OF THE INVENTION

The present invention relates to a memory device; and, more particularly, to a cell array of a nonvolatile ferroelectric memory device and an apparatus for driving such a cell array.

BACKGROUND OF THE PRIOR ARTS

Generally, a nonvolatile ferroelectric memory device, i.e., a FeRAM (Ferroelectric Random Access Memory) device, processes signal data as fast as DRAM (Dynamic Random Access Memory) and it conserves stored data when power is not supplied so that this memory has been focused on the next generation storage device.

The cell structure of the FeRAM device is similar to that of the DRAM, i.e., the FeRAM device has one switching device (transistor) and one capacitor. Accordingly, the FeRAM device is a memory device having a unit cell of a 1T/1C structure and makes a use of a high remnant polarization of a ferroelectric material in a capacitor. This high remnant polarization contributes the FeRAM device to maintain stored data when an electric field is not applied to the capacitor.

FIG. 1 is a hysteresis loop illustrating characteristics of a nonvolatile ferroelectric memory device.

Referring to FIG. 1, the polarization induced by an electric field is not extinguished even though thereafter the electric field is not applied to the ferroelectric material and this feature is called "remnant polarization" or "spontaneous polarization." As shown in the hysteresis loop of FIG. 1, an amount of the polarization (d, a) is maintained when the applied voltage is "0". The nonvolatile ferroelectric memory cell is indicative of a logic value "1" at the state of "d" and is indicative of a logic value "0" at the state of "a."

A cell array of a nonvolatile ferroelectric memory device and a method for driving such a nonvolatile ferroelectric memory device will be described in detail referring to the accompanying drawings.

FIG. 2A is a schematic view of two unit cells in a conventional split word line structure, FIG. 2B is a circuit diagram for driving the unit cell in FIG. 2A and FIG. 3 is a timing chart illustrating the operation of the circuit in FIG. 2B.

First, referring to FIG. 2A, the unit cell of the split word line structure includes a first split word line SWL1 and a second split word line SWL2 which are extended in the direction of row, a first bit line BL1 and a second bit line BL2 crossing the first and second split word lines SWL1 and SWL2, a first transistor T1 having a gate connected to the first split word line SWL1 and a drain connected to the first bit line BL1, a first ferroelectric capacitor FC1 formed between the second split word line SWL2 and a source of the first transistor T1, a second transistor T2 having a gate connected to the second split word line SWL2 and a drain connected to the second bit line BL2, and a second ferroelectric capacitor FC2 formed between the first split word line SWL1 and a source of the first transistor T2.

A cell array is composed a plurality of unit cells mentioned above. In FIG. 2A, the unit cell makes up of a pair of split word lines SWL1 and SWL2, one bit line BL1, one transistor T1 and one ferroelectric capacitor FC1 in the meaning of data storage; however, the unit cell can be taken by a pair of split word lines SWL1 and SWL2, two bit lines BL1 and BL2, two transistors T1 and T2 and two ferroelectric capacitors FC1 and FC2 in the meaning of structure The operation of the unit cell of the split word line structure will be describe below in detail referring to the FIG. 2B.

As shown in FIG. 2B, a plurality of split word line pairs, which has the first and second split word lines SWL1 and SWL2 respectively, are formed in a direction of row and a plurality of bit lines cross the split word pairs lines in a direction of column. As a result, in case where there are n cells (T1/1C) in a direction of row, n+1 bit lines are required to read out data from the unit cell. A sense amplifier for sensing a voltage difference between the first and second bit lines and amplifying the voltage difference are provided and two output nodes of the sense amplifier are respectively connected to a data bus line DL and a data bus bar line /DL.

At this time, a sensing enable signal SEN enables the sense amplifier to amplify the voltage difference and the amplified voltage difference signal from the sense amplifier is transmitted to the dada bus lines DL and /DL in response to a column selection signal CS which is applied to a switching transistor.

The operation of the nonvolatile ferroelectric memory device will be descried referring to FIG. 3 showing a timing chart of the circuit in FIG. 2B.

As illustrated in FIG. 3, at time t0, a chip enable signal /CE (in a low level at the time of activation) is activated to a low level when a bit line equalizing signal EQ is in a high level and the first and second split word lines SWL1 and SWL2 are in a low level. At this time, the bit lines SL1 and BL2 are precharged and the voltage level of the precharge generally setup to a threshold voltage of an NMOS transistor.

At time t1, the bit line equalizing signal EQ is in a low level for data sensing operation and the first and second split word lines SWL1 and SWL2 are activated to a high level. Data stored in the ferroelectric capacitor are transferred to the bit lines BL1 and BL2 according to the activation of the first and second split word lines SWL1 and SWL2. When logic data "1(high level voltage)" is sorted in the ferroelectric capacitor, a voltage level on the bit line BL1 is highly increased because the point "d" is moved to the point "f" in FIG. 1 with the charge sharing between the bit line BL1 and the ferroelectric capacitor. However, when logic data "0(low level voltage)" is sorted in the ferroelectric capacitor, a voltage level on the bit line BL1 is increased a little because the point "a" is moved to the point "f" in FIG. 1 with the charge sharing between the bit line BL1 and the ferroelectric capacitor At time t2, the sense amplifier is enabled in response to the sense amplifier enable signal SEN after the cell data are transferred to the bit lines BL1 and BL2 and the first and second split word lines SWL1 and SWL2 are activated.

On the other hand, since the logic data "1" can not be restored at a state that the first and second split word lines SWL1 and SWL2 are in a high level, data restoration should be achieved at time t3. At time t3, the column selection signal CS is activated to a high voltage level and the bit lines are electrically connected to the data bus lines. Data on the bit lines are transferred to the data bus lines at a read operation and data on the data bus lines are transferred to the bit lines are a write operation. Also, at time t3, the first split word line SWL1 is transited to a low level but the second split word line SWL2 keeps the voltage level low, thereby turning on the second transistor T2. At this time, in case where the second bit line BL2 is in a high level, a voltage level corresponding to the high level on the bit line BL2 is transferred to one of terminals of the second ferroelectric capacitor FC2. The other the other of terminals of the second ferroelectric capacitor FC2 is electrically connected to the first split word line SWL1 with a low level. Accordingly, the logic data "1" is restored.

At time t4, in case where logic data "0" are on the first bit line BL1 or the second bit line BL2, i.e., logic data "0" write operation, the first split word line SWL1 is transited to a high level and then the logic data "0" is written in the first ferroelectric capacitor FC1. However, in case where the first and second bit lines BL1 and BL3 are in a high level, there is no change of cell data.

Also, at time t5, the first split word line SWL1 is in a high level but the second split word line SWL2 transited to a low level, thereby turning on the first transistor T1. At this time, in case where the first bit line BL1 is in a high level, a voltage level corresponding to the high level on the bit line BL2 is transferred to one of terminals of the first ferroelectric capacitor FC1. The other the other of terminals of the first ferroelectric capacitor FC1 is electrically connected to the second split word line SWL2 with a low level. Accordingly, the logic data "1" is restored.

Finally, at time t6, the equalizing signal is activated to a high level so that charge sharing is achieved between the first and second bit lines BL1 and BL2 for the next operation.

As mentioned above, the conventional ferroelectric memory device has a split word line structure to decrease a load on a plate line; however, this has limitations on a chip size, especially in a cell array and a driving circuit of cells.

SUMMARY OF THE INVENTION

An object of the present invention is to provide a cell array of a nonvolatile ferroelectric memory device with a small chip size in a split word line structure, which is capable of dramatically decreasing a load on a plate line.

Another object of the present invention is to provide an apparatus for driving a cell array of a nonvolatile ferroelectric memory device with a small chip size in a split word line structure.

Further another object of the present invention is to provide a driving apparatus for improving a self-boost efficiency in a split word line driver for a cell array of a nonvolatile ferroelectric memory device with a low operation voltage.

According to an aspect of the present invention, there is provided a nonvolatile ferroelectric memory device comprising: a cell array region having first and second cell array blocks which are adjacent to each other and independently operate; a first drive region being adjacent to the first cell array block in the cell array region in order to drive first split words line which operate as plate lines of the first cell array block and word lines of the second cell array block; and a second drive region being adjacent to the second cell array block in the cell array region in order to drive first split word lines which operate as plate lines of the second cell array block and word lines of the first cell array block, wherein each of the first and second drive regions includes a plurality of split word line drivers and wherein each of the split word line drivers is connected to the plate lines of the first and second cell array blocks correspondent thereto.

According to another aspect of the present invention, there is provided a nonvolatile ferroelectric memory device comprising: a first cell array region having first and second cell array blocks which are adjacent to each other and independently operate; a first cell array region having third and fourth cell array blocks which are adjacent to each other and independently operate; a first drive region being adjacent to the first cell array block in order to drive first split word lines which operate as plate lines of the first cell array block and word lines of the second cell array block; a second drive region being adjacent to the second and third cell array blocks between the first and second cell array region in order to drive second split word lines which operate as plate lines of the second and third cell array blocks and word lines of the first and fourth cell array blocks; and a third drive region being adjacent to the fourth cell array block in order to drive third split word lines which operate as plate lines of the fourth cell array block and word lines of the third cell array block, wherein each of the first to fourth dive regions includes a plurality of split word line drivers and wherein each of the split word line drivers is connected to the plate lines of the first to fourth cell array blocks correspondent thereto.

According to still another aspect of the present invention, there is provided a nonvolatile ferroelectric memory device comprising: first and second cell array blocks which are adjacent to each other and independently operate; first split word lines operating as word lines of first memory cells corresponding to a first row of the first cell array block and as plate lines of second memory cells corresponding to a second row of the second cell array block; second split word lines operating as plate lines of the first memory cells and as word lines of third memory cells corresponding to a first row of the second cell array block; third split word lines operating as word lines of fourth memory cells corresponding to a second row of the first cell array block and as plate lines of the third memory cells; fourth split word lines operating as plate lines of the fourth memory cells and as word lines of the second memory cells; a first split word line driver for driving the second split word lines, being adjacent to the first cell array block and being connected to the plate lines of the first memory cells; a second split word line driver for driving the fourth split word lines, being adjacent to the first cell array block and being connected to the plate lines of the fourth memory cells; a third split word line driver for driving the third split word lines, being adjacent to the second cell array block and being connected to the plate lines of the third memory cells; and a fourth split word line driver for driving the first split word lines, being adjacent to the second cell array block and being connected to the plate lines of the second memory cells.

According to still another aspect of the present invention, there is provided a nonvolatile ferroelectric memory device comprising: first and second cell array blocks which are adjacent to each other and independently operate; third and fourth cell array blocks which are adjacent to each other and independently operate; first split word lines operating as word lines of first memory cells corresponding to a first row of the first cell array block, as plate lines of second memory cells corresponding to a second row of the second cell array block, as plate lines of third memory cells corresponding to a second row of the third cell array block and as word lines of fourth memory cells corresponding to a first row of the fourth cell array block; second split word lines operating as plate lines of the first memory cells and as word lines of fifth memory cells corresponding to a first row of the second cell array block; third split word lines operating as word lines of sixth memory cells corresponding to a second row of the first cell array block, as plate lines of the fifth memory cells, as plate lines of seventh memory cells corresponding to a first row of the third cell array block and as word lines of eighth memory cells corresponding to a second row of the fourth cell array block; fourth split word lines operating as plate lines of the sixth memory cells and as word lines of the second memory cells; fifth split word lines operating as plate lines of the fourth memory cells and as word lines of the seventh memory cells; sixth split word lines operating as plate lines of the eighth memory cells and as word lines of the third memory cells; a first split word line driver for driving the second split word lines, being adjacent to the first cell array block and being connected to the plate lines of the first memory cells; a second split word line driver for driving the fourth split word lines, being adjacent to the first cell array block and being connected to the plate lines of the sixth memory cells; a third split word line driver for driving the third split word lines, being adjacent to the second and third cell array blocks and being connected to the plate lines of the fifth and seventh memory cells; a fourth split word line driver for driving the first split word lines, being adjacent to the second and third cell array blocks and being connected to the plate lines of the third memory cells; a fifth split word line driver for driving the fifth split word lines, being adjacent to the fourth cell array block and being connected to the plate lines of the fourth memory cells; and a sixth split word line driver for driving the sixth split word lines, being adjacent to the fourth cell array block and being connected to the plate lines of the eighth memory cells.

According to still another aspect of the present invention, there is provided a nonvolatile ferroelectric memory device comprising: first and second cell array blocks which independently operate; an address path changing adjustor for decoding a plurality of row address predecoder input signals, outputting a plurality of row address predecoder output signals which are respectively corresponding to a plurality of split word lines, wherein the address path changing adjustor changes an input order of the row address predecoder input signals in response to a control signal to determine whether the first or second cell array block operates and produces order-changed row address predecoder output signals; a word line/plate line control signal path changing adjustor for receiving the row address predecoder output signals from the address path changing adjustor, word line control signal and a plate line control signal and outputting a plurality of split word lines driving signals, wherein the word line/plate line control signal path changing adjustor changes operational features of the split word lines driving signals in response to the control signal so that each of split word lines driving signals drive word lines or a plate line in the first and second cell array blocks; a level shifter boosting the plurality of the split word lines driving signals; and a plurality of split word lines driving part for driving the split word lines in response to output signals from the level shifter.

According to still another aspect of the present invention, there is provided a nonvolatile ferroelectric memory device comprising: first and second cell array blocks which independently operate in a split word line structure, wherein each of the first to fourth cell array blocks has a hierarchical bit line structure having a plurality of local bit lines correspondent to each of columns and a global bit line which is selectively connected to one of the plurality of the local bit lines by a plurality of switching transistors; driving means for driving a split word line in the split word line structure, wherein the driving means includes: an output terminal connected to the split word line; decoding means for receiving a plurality of row address signals and activating the split word line; pull-down means for carrying out a pull-down operation at the output terminal when the split word line are nonactivated; pull-down control means for controlling the pull-down means in response to an output signal from the decoding means and an external control signal; pull-up means for supplying a pumping voltage to the output terminal; and pull-up control means for controlling the pull-up means by applying the output signal from the decoding means to the pull-up means in response to word line control signal.

According to still another aspect of the present invention, there is provided a nonvolatile ferroelectric memory device comprising: a cell array region having first and second cell array blocks which are adjacent to each other and independently operate; a first drive region being adjacent to the first cell array block in the cell array region in order to drive first split word lines which operate as plate lines of the first cell array block and word lines of the second cell array block; a second drive region being adjacent to the second cell array block in the cell array region in order to drive first split word lines which operate as plate lines of the second cell array block and word lines of the first cell array block; and a sub drive region disposed between the first and second cell array regions, wherein the sub drive region controls a signal flow between the plate lines of the first cell array block and the word lines of the second cell array block and controls a signal flow between the plate lines of the second array block and the word lines of the first cell array block, wherein each of the first and second drive regions includes a plurality of split word line drivers and wherein each of the split word line drivers is connected to the plate lines of the first and second cell array blocks correspondent thereto.

According to still another aspect of the present invention, there is provided a nonvolatile ferroelectric memory device comprising: a first cell array region having first and second cell array blocks which are adjacent to each other and independently operate; a first cell array region having third and fourth cell array blocks which are adjacent to each other and independently operate; a first drive region being adjacent to the first cell array block in order to drive first split word lines which operate as plate lines of the first cell array block and word lines of the second cell array block; a second drive region being adjacent to the second and third cell array blocks between the first and second cell array region in order to drive second split word lines which operate as plate lines of the second and third cell array blocks and word lines of the first and fourth cell array blocks; a third drive region being adjacent to the fourth cell array block in order to drive third split word lines which operate as plate lines of the fourth cell array block and word lines of the third cell array block; a first sub drive region disposed between the first and second cell array regions, wherein the sub drive region controls a signal flow between the plate lines of the first cell array block and the word lines of the second cell array block and controls a signal flow between the plate lines of the second array block and the word lines of the first cell array block; and a first sub drive region disposed between the third and fourth cell array regions, wherein the sub drive region controls a signal flow between the plate lines of the third cell array block and the word lines of the fourth cell array block and controls a signal flow between the plate lines of the fourth array block and the word lines of the third cell array block, wherein each of the first to fourth dive regions includes a plurality of split word line drivers and wherein each of the split word line drivers is connected to the plate lines of the first to fourth cell array blocks correspondent thereto.

According to still another aspect of the present invention, there is provided a nonvolatile ferroelectric memory device comprising: first and second cell array blocks which independently operate in a split word line structure, wherein each of the first to fourth cell array blocks has a hierarchical bit line structure having a plurality of local bit lines correspondent to each of columns and a global bit line which is selectively connected to one of the plurality of the local bit lines by a plurality of switching transistors; driving means for driving a split word line in the split word line structure, wherein the driving means includes: an output terminal connected to a plate line of the first cell array block; decoding means for receiving a plurality of row address signals and activating the plate line of the first cell array block; pull-down means for carrying out a pull-down operation at the output terminal when the plate line of the first cell array block are nonactivated; pull-down control means for controlling the pull-down means in response to an output signal from the decoding means and an external control signal; pull-up means for supplying a pumping voltage to the output terminal; and pull-up control means for controlling the pull-up means by applying the output signal from the decoding means to the pull-up means in response to word line control signal.

According to still another aspect of the present invention, there is provided a nonvolatile ferroelectric memory device comprising: first and second cell array blocks which independently operate in a split word line structure, wherein each of the first to fourth cell array blocks has a hierarchical bit line structure having a plurality of local bit lines correspondent to each of columns and a global bit line which is selectively connected to one of the plurality of the local bit lines by a plurality of switching transistors; a split word line formed by a connection between a plate line of the first cell array block and a word line of the second cell array block; a switching transistor selectively connecting the plate line and the word line; and a control transistor for controlling a gate of the switching transistor and floating the plate line during the cell operation.

According to still another aspect of the present invention, there is provided a nonvolatile ferroelectric memory device comprising: a global bit line; a plurality of local bit lines, each of which is connected to a unit cell in a memory block; a plurality of switching means for selectively connecting a global bit line to one of the plurality of local bit lines; a reference line connected to a reference cell; sensing means for reading out data by comparing a voltage difference between the a global bit line a reference line; pull-down means for reducing a voltage level on the global bit line in response to a voltage level on the local bit line.

BRIEF DESCRIPTION OF THE DRAWINGS

The understanding of the invention and are incorporated in and constitute a part of this application, illustrate embodiments of the invention and together with the description serve to explain the principle of the invention. In the drawings.

DETAILED DESCRIPTION OF THE INVENTION

Hereinafter, a cell array of a nonvolatile ferroelectric memory device according to the present invention will be described below in detail accompanying drawings.

Figure 1:
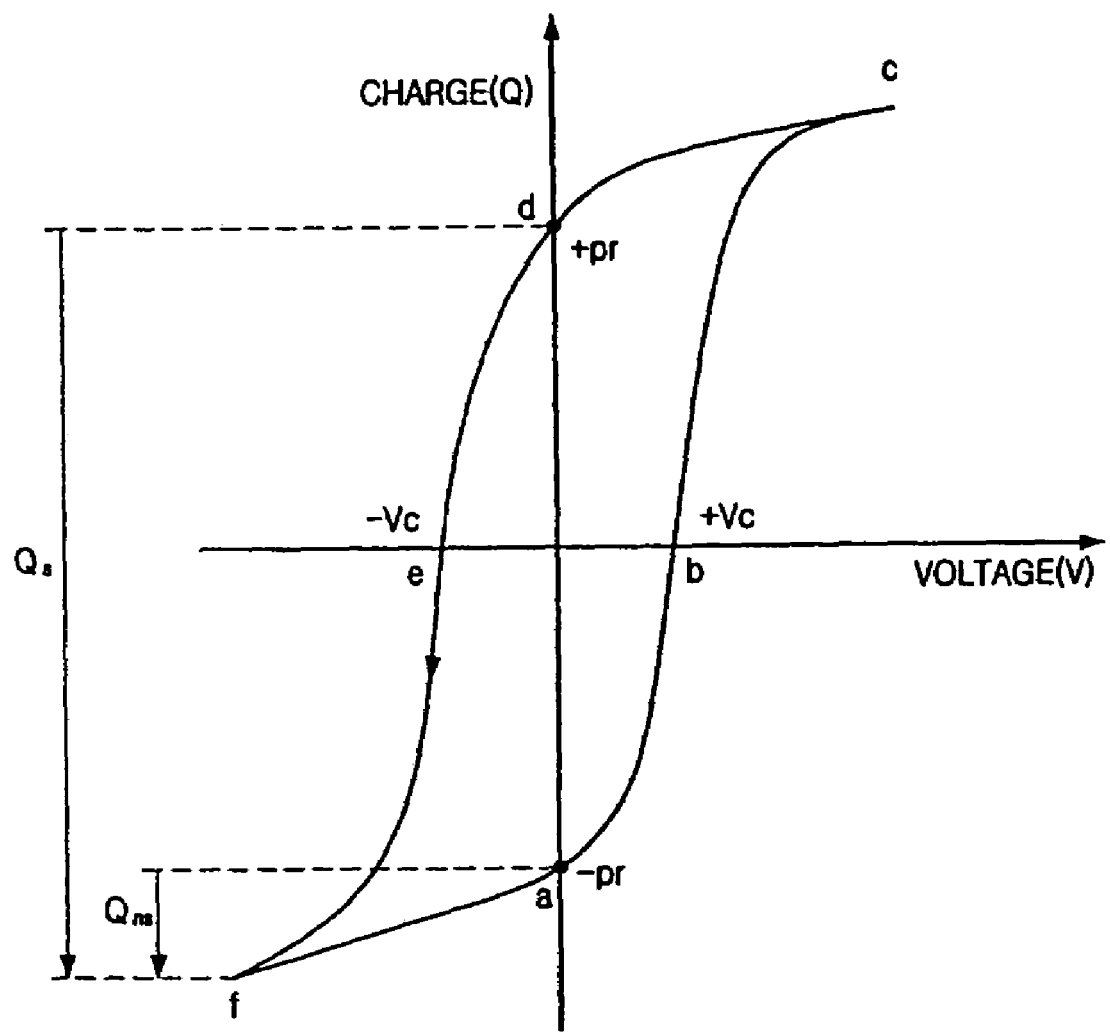
FIG. 1 is a hysteresis loop illustrating characteristics of a nonvolatile ferroelectric memory device.
Figure 2A:
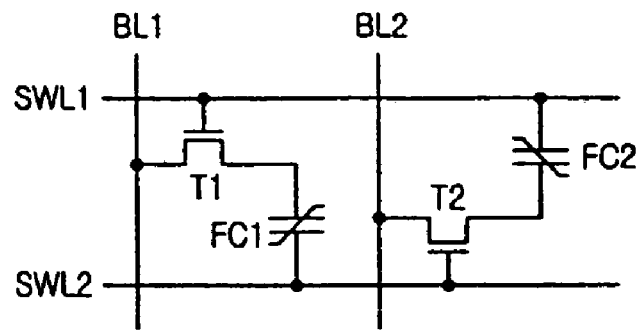
FIG. 2A is a unit cell structure of a conventional nonvolatile ferroelectric memory device having a split word line.
Figure 2B:
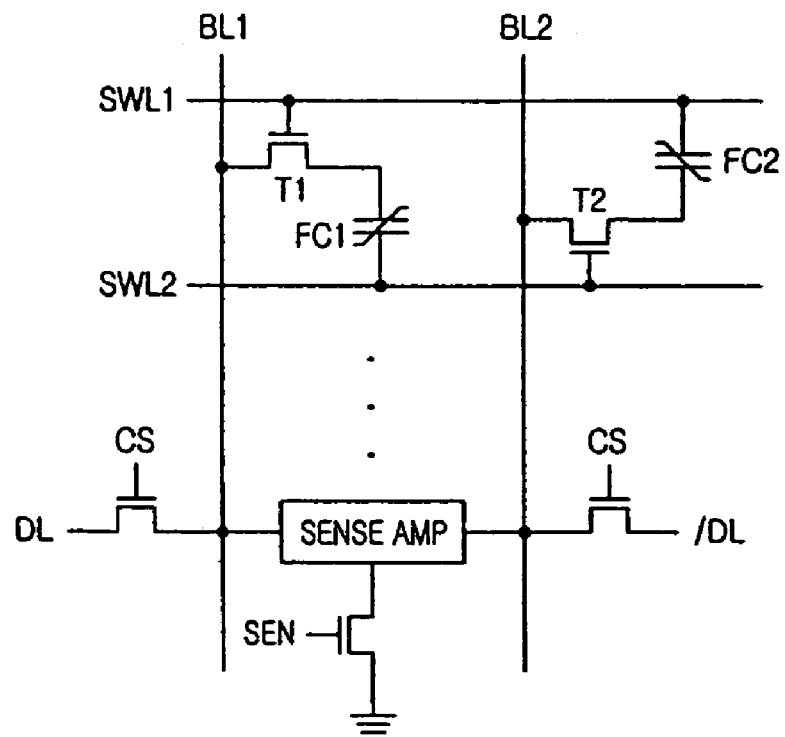
FIG. 2B is a circuit diagram for driving the unit cell in FIG. 2A.
Figure 3:
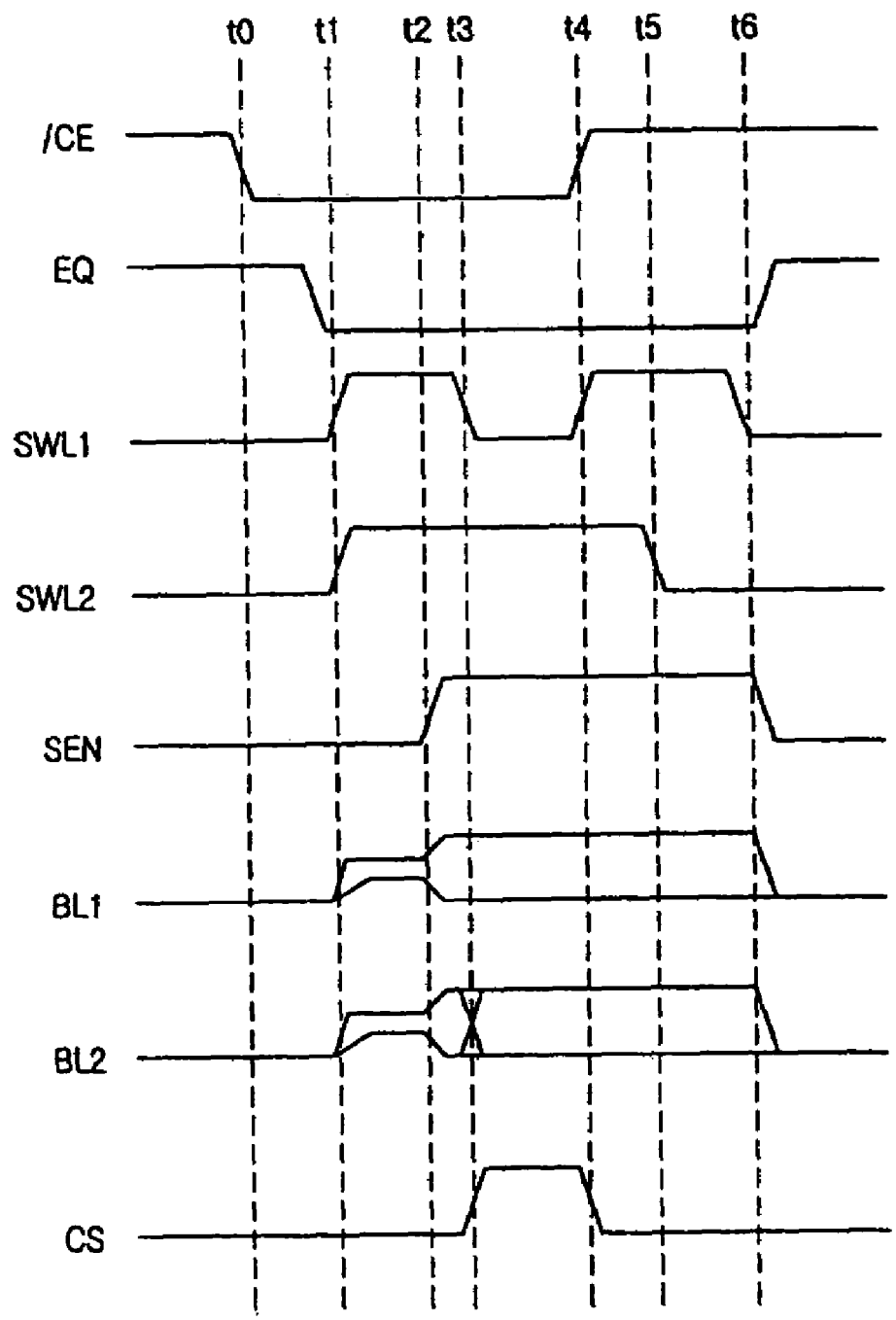
FIG. 3 is a timing chart illustrating the operation of the circuit in FIG. 2B.
Figure 4:
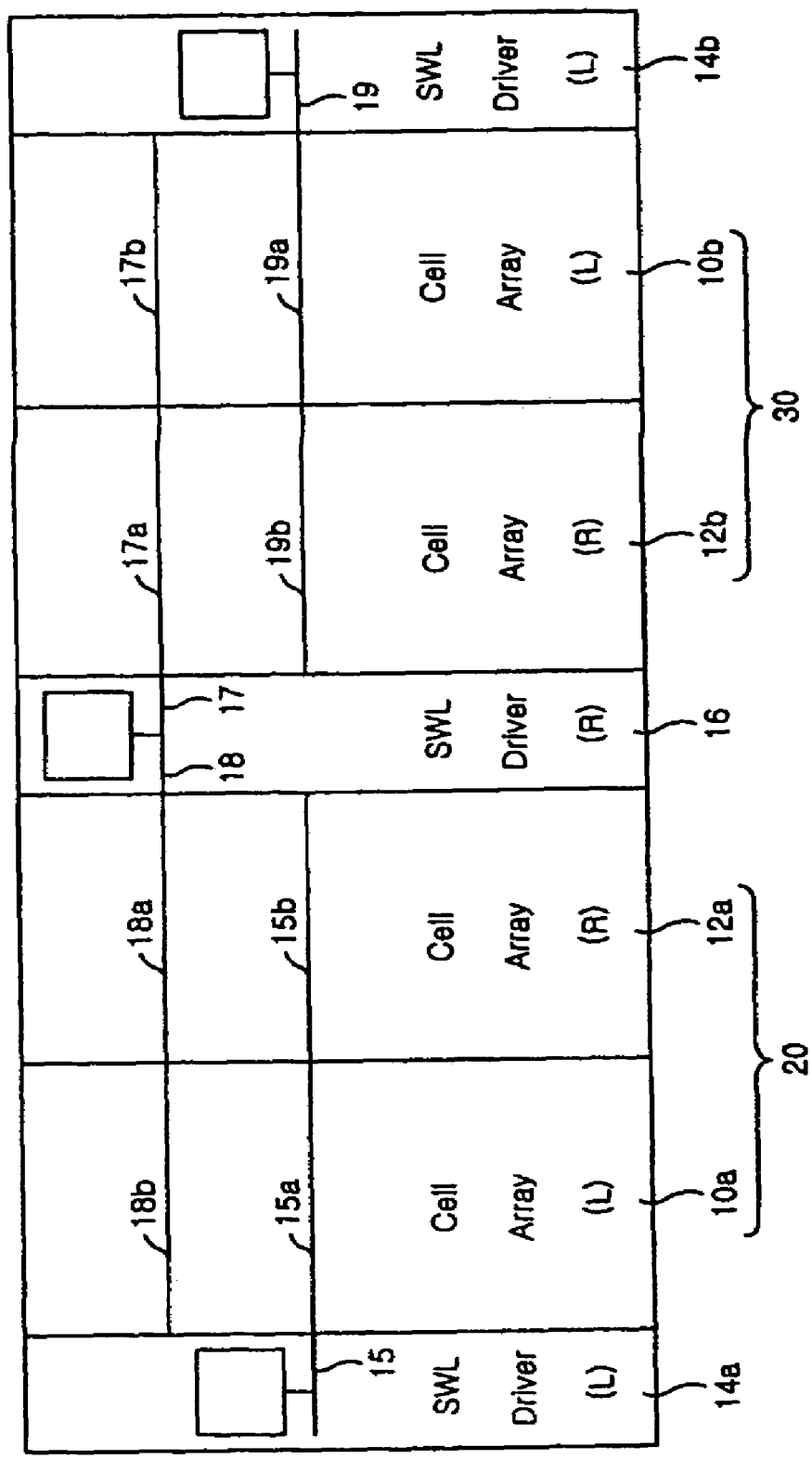
FIG. 4 is a schematic view illustrating a ferroelectric memory device according to an embodiment of the present invention.

First, FIG. 4 is a schematic block diagram illustrating a cell array structure of a nonvolatile ferroelectric memory device according to an embodiment of the present invention.

Referring to FIG. 4, the cell array structure according to the present invention includes a cell array region 20, another cell array region 30 which is adjacent to the cell array region 20, and split word line drivers 14a, 14b and 16. The cell array region 20 includes cell array blocks 10a and 12a that independently operate and also the cell array region 30 includes cell array blocks 10b and 12b that independently operate.

The split word line driver 14a is adjacent to the cell array block 10a to drive a shared split word line 15 which is connected to the a plate line 15a of the cell array block 10a and a word line 15b of the cell array block 12a. The split word line driver 16 is disposed between the cell array regions and 30 and, more particularly, between the cell array blocks 12a and 12b. The split word line driver 16 drives a shared split word line 18 which is connected to the a plate line 18a of the cell array block 12a and a word line 18b of the cell array block 10a and drives a shared split word line 17 which is connected to the a plate line 17a of the cell array block 12b and a word line 17b of the cell array block 10b. In similar, The split word line driver 14b is adjacent to the cell array block 10b to drive a shared split word line 19 which is connected to the a plate line 19b of the cell array block 12b and a word line 19a of the cell array block 10b.

As state above, the cell array structure according to the present invention includes four cell array blocks 10a, 12a, 10b and 12b and three split word line drivers 14a, 16 and 14b as a unit operation bock and the whole cell array structure according to the present invention includes a plurality of unit operation bocks.

In the unit operation bock, the cell array blocks are symmetrically disposed centering around the split word line driver 16. That is, the cell array blocks 10a and 12a are disposed on the left of the split word line driver 16 and the cell array blocks 10b and 12b are disposed on the right of the split word line driver 16. The split word line driver 14a is disposed on the outmost left of the split word line driver 16 and the split word line driver 14b is disposed on the outmost right of the split word line driver 16.

In similar to the conventional FeRAM devices, two split word lines in the present invention are connected to one memory cell, one of which is connected, as a word line, to a gate of a switching transistor in the cell, as a word line, and the other of which is connected to a plate of a capacitor in the cell as a plate line.

The split word line driver 16 drives the plate lines of the ferroelectric capacitors in the most adjacent cell array blocks 12a and 12b on the left and right thereof and drives the gates of switching transistors (word line) in the cells of the cell array blocks 10a and 10b.

The split word line driver 14a drives the plate lines of the capacitors in the cell array blocks 10a and the switching transistor gates in the cell array block 12a. The split word line driver 14b drives the plate lines of the capacitors in the cell array blocks 10b and the switching transistor gates in the cell array block 12b. Namely, all of the split word line drivers 14a and 14b drive the plate lines of the cell capacitor when they drive the most adjacent cell array blocks on the left and right thereof and drive the gate of the switching transistors in the next adjacent cell array blocks.

In case that the cell array blocks 10a and 12a are respectively driven by the split word line drivers 14a and 16 in FIG. 4, the cell array block 12a does not operate while the cell array block 10a is operating and the cell array block 10a does not operate while the cell array block 12a is operating. As a result, the cell array blocks 10a and 12a independently operate at the different time.

Although another unit operation block is not shown in FIG. 4, it may be adjacent to the unit operation block on the left and right thereof and collaborates with the split word line drivers 14a and 14b on its left and right.

Figure 5:
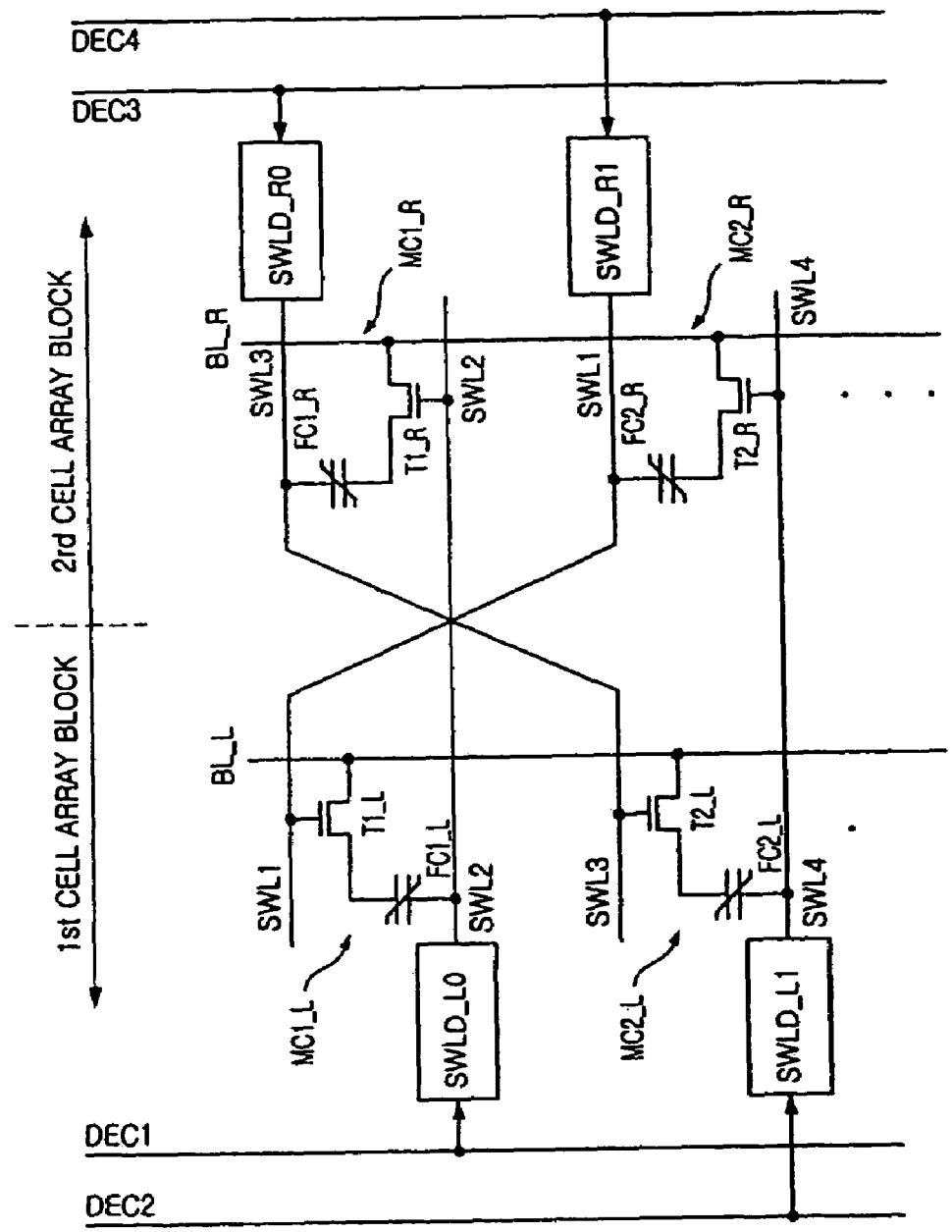
FIG. 5 is schematic view illustrating a cell structure in two cell array blocks to which split word lines and a SWL driver are connected in FIG. 4.

FIG. 5 is schematic view illustrating the cell structure in the two cell array blocks to which the split word line and the SWL driver are connected.

Referring to the FIG. 5, a first cell array block corresponds to the cell array block 10a in FIG. 4 and a second cell array block corresponds to the cell array block 12a in FIG. 4. Although the first and second cell array blocks are respectively shown to have memory cells in one column in FIG. 4, they may have a plurality of columns. That is, the first and second cell array blocks have a plurality of bit lines BL_L and BL_R, respectively. Further, the first and second cell array blocks have a plurality of memory cells in a row and two memory cells connected to four split word lines operate as a unit structure and a plurality of unit structures make the FeRAM device of the present invention.

In the first cell array block, a first split word line SWL1 is used as a gate line of a memory cell MC1_L corresponding to the first row; a second split word line SWL2 is used as a plate line of a memory cell MC1_L corresponding to the first row; a third split word line SWL3 is used as a gate line of a memory cell MC2_L corresponding to the second row; and a fourth split word line SWL4 is used as a plate line of a memory cell MC2_L corresponding to the second row.

Similarly, in the second cell array block, the first split word line SWL1 is used as a plate line of a memory cell MC2_R corresponding to the second row; the second split word line SWL2 is used as a gate line of a memory cell MC1_R corresponding to the first row; the third split word line SWL3 is used as a plate line of a memory cell MC1_R corresponding to the first row; and the fourth split word line SWL4 is used as a gate line of a memory cell MC2_R corresponding to the second row.

The memory cell MC1_L of the first row in the first cell array block has a transistor T1_L having a gate connected to the first split word line SWL1 and a source connected to the bit line BL_L and a ferroelectric capacitor FC1_L having two electrodes, one of which is connected to the drain of the transistor T1_L and the other of which is connected to the second split word line SWL2.

In the first cell array block, the memory cell MC2_L of the second row has a transistor T2_L having a gate connected to the third split word line SWL3 and a source connected to the bit line BL_L and a ferroelectric capacitor FC2_L having two electrodes, one of which is connected to the drain of the transistor T2_L and the other of which is connected to the fourth split word line SWL4.

In the second cell array block, the memory cell MC1_R of the first row has a transistor T1_R having a gate connected to the second split word line SWL2 and a source connected to the bit line BL_R and a ferroelectric capacitor FC1_R having two electrodes, one of which is connected to the drain of the transistor T1_R and the other of which is connected to the third split word line SWL3.

Further, in the second cell array block, the memory cell MC2_R of the second row has a transistor T2_R having a gate connected to the fourth split word line SWL4 and a source connected to the bit line BL_R and a ferroelectric capacitor FC2_R having two electrodes, one of which is connected to the drain of the transistor T2_R and the other of which is connected to the first split word line SWL1.

The first split word line SWL1 and the third split word line SWL3 cross each other on the boundary between the first and second cell array blocks and on the second split word line SWL2.

In FIG. 4, a SWL driver SWLD_R1 is formed in the vicinity of the memory cell MC2_R in the second cell array block and drives the first split word line SWL1; a SWL driver SWLD_L0 is formed in the vicinity of the memory cell MC1_L in the first cell array block and drives the second split word line SWL2; a SWL driver SWLD_R0 is formed in the vicinity of the memory cell MC1_R in the second cell array block and drives the third split word line SWL3; and a SWL driver SWLD_L1 is formed in the vicinity of the memory cell MC2_L in the first cell array block and drives the fourth split word line SWL4. Accordingly, the SWL drivers SWLD_R1, SWLD_L0, SWLD_R0 and SWLD_L1 drive the first to fourth split word line SWL1 to SWL4, respectively, in response to a row address signal, a word line control signal WLC and a plate control signal PLC.

Figure 6:
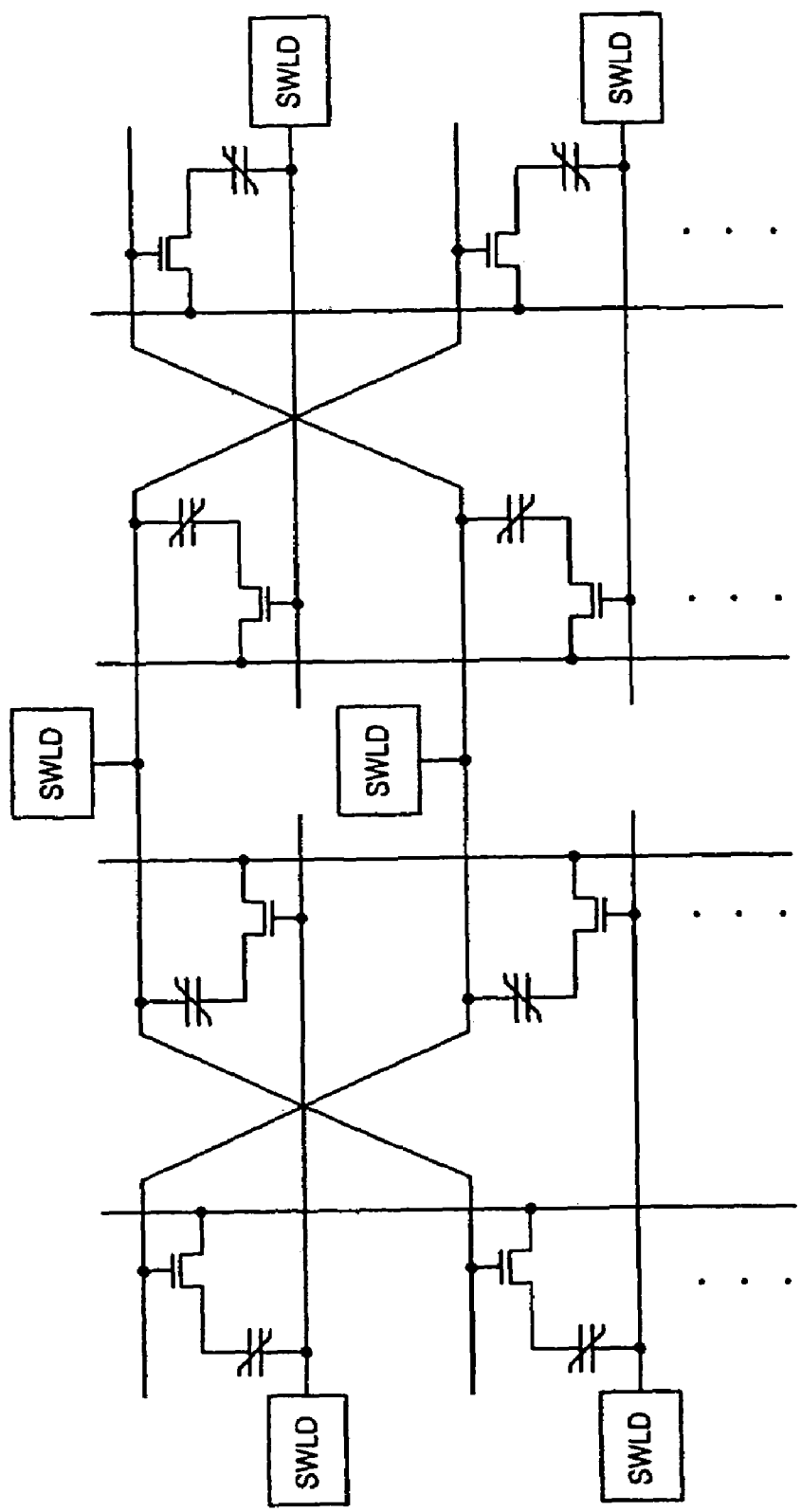
FIG. 6 is a schematic view of a scheme having four adjacent cell array blocks to show a cell structure and a connection between the split word lines and the SWL drivers.

FIG. 6 is a schematic view of a scheme having four adjacent cell array blocks to show a cell structure and a connection between the split word lines and the SWL drivers.

Figure 7:
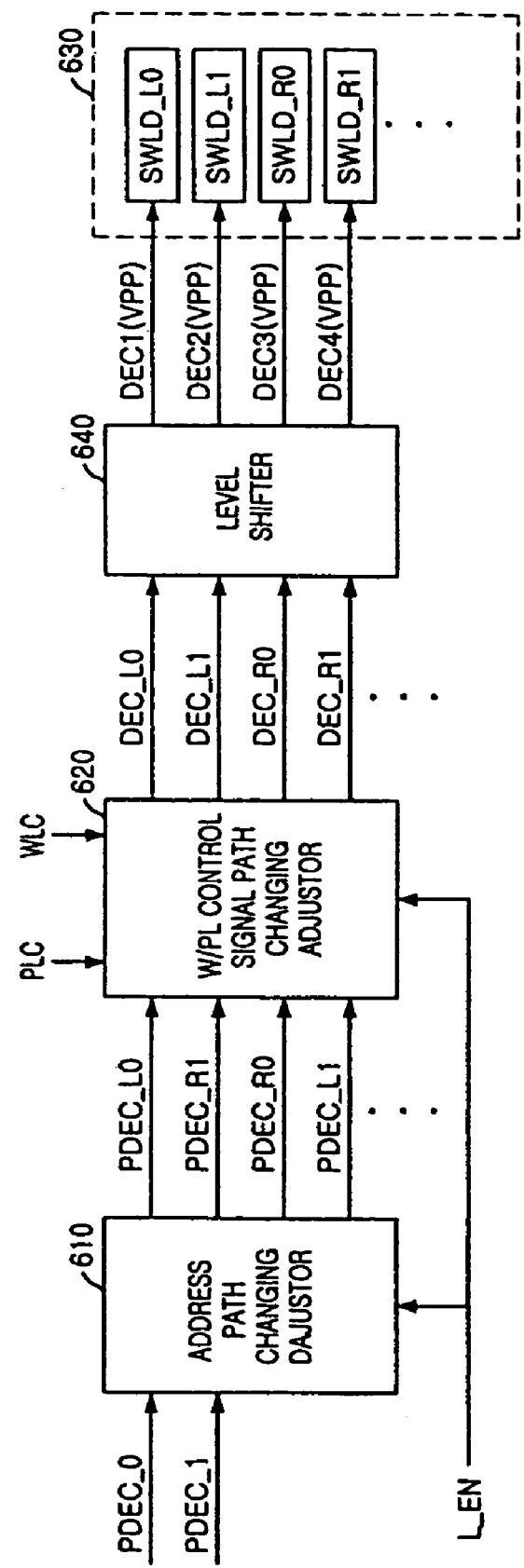
FIG. 7 is a block diagram illustrating a split word line driving apparatus including the SWL driver according to an embodiment of the present invention.

FIG. 7 is a block diagram illustrating a split word line driving apparatus including the SWL driver according to the present invention.

Referring to FIG. 7, the split word line driving apparatus according to the present invention includes an address path changing adjustor 610, a WL/PL (word line/plate line) control signal path changing adjustor 620, a level shifter 640 and a SWL driving part 630.

The address path changing adjustor 610 decodes row address predecoder input signals PDEC_0 and PDEC_1 and outputs path-changed row address predecoder output signals PDEC_L0, PDEC_R1, PDEC_R0 and PDEC_L1 which corresponds to the first to fourth split word lines SWL1, SWL2, SWL3 and SWL4 in response to a control signal L_EN.

On the other hand, the first or second cell array block may independently operate, as stated above, according to an activation of the first or second cell array block. To satisfy this independent operation, one of the row address predecoder output signals PDEC_L0, PDEC_R1, PDEC_R0 and PDEC_L1 is produced in the address path changing adjustor 610 based on an input order of the row address predecoder input signals PDEC_0 and PDEC_1.

The reason why the different row address predecoder input signals PDEC_0 and PDEC_1 are required to selectively active one of the first and second cell array blocks is that the second and fourth split word lines SWL2 and SWL4 are respectively included in the same row of the first and second cell array blocks so that the first and second cell array blocks receive the same row address signal (however, the first and third split word line SWL1 and SWL2 crosses each other on the boundary between the first and second cell array blocks) and each of them is used as the plate line of the ferroelectric capacitor in the different row. That is, the first split word line SWL1 corresponds to a word line of the first row in the first cell array block and corresponds to a plate line of the second row in the second cell array block so that the SWL driver SWLD_R1 drives the word line of the memory cell in the first row when the first cell array block is activated. Similarly, the third split word line SWL3 corresponds to a word line of the second row in the first cell array block and corresponds to a plate line of the first row in the second cell array block so that the SWL driver SWLD_R0 drives the word line of the memory cell in the second row when the first cell array block is activated.

Accordingly, the address path changing adjust or 610 determines a signal path of the row address predecoder input signal in response to a logic level of the control signal L_EN, which is determined by an activation of the first or second cell array block.

The WL/PL control signal path changing adjustor 620 receives the path-changed row address predecoder output signals PDEC_L0, PDEC_R1, PDEC_R0 and PDEC_L1, a word line control signal WLC and a plate line control signal PLC and produces SWL driving signals DEC_L0, DEC_L1, DEC_R0 and DEC_R1 in response to a logic level of the control signal L_EN.

The determination whether the SWL driver is used as the word line or the plate line is dependent upon the activation of the first or second cell array block. By doing such a decision, the WL/PL control signal path changing adjustor 620 adjusts the path-changed row address predecoder output signals PDEC_L0, PDEC_R1, PDEC_R0 and PDEC_L1 in response to a logic level of the control signal L_EN.

Referring again to FIG. 5, the SWL drivers SWLD_L0 and SWLD_L1 drive the plate lines of the memory cells MC1_L and MC2_1, respectively, when the first cell array block is activated, and the SWL drivers SWLD_R0 and SWLD_R1 drive the word lines of the memory cells MC1_R and MC2_R, respectively, when the second cell array block is activated. The SWL drivers SWLD_L0 and SWLD_L1 drive the word lines of the memory cells MC1_R and MC2_R, respectively, when the second cell array block is activated, and the SWL drivers SWLD_R0 and SWLD_R1 drive the plate lines of the memory cells MC1_R and MC2_R, respectively, when the second cell array block is activated. As a result, in the present invention, the operation features of the SWL drivers are changed by the activation of the first or second cell array block.

The level shifter 640 shifts voltage levels of the SWL driving signals DEC_L0, DEC_L1, DEC_R0 and DEC_R1 from the WL/PL control signal path changing adjustor 620 to high voltage levels of VPP and outputs the shifted voltage signals to the SWL driving part 630.

Figure 8:
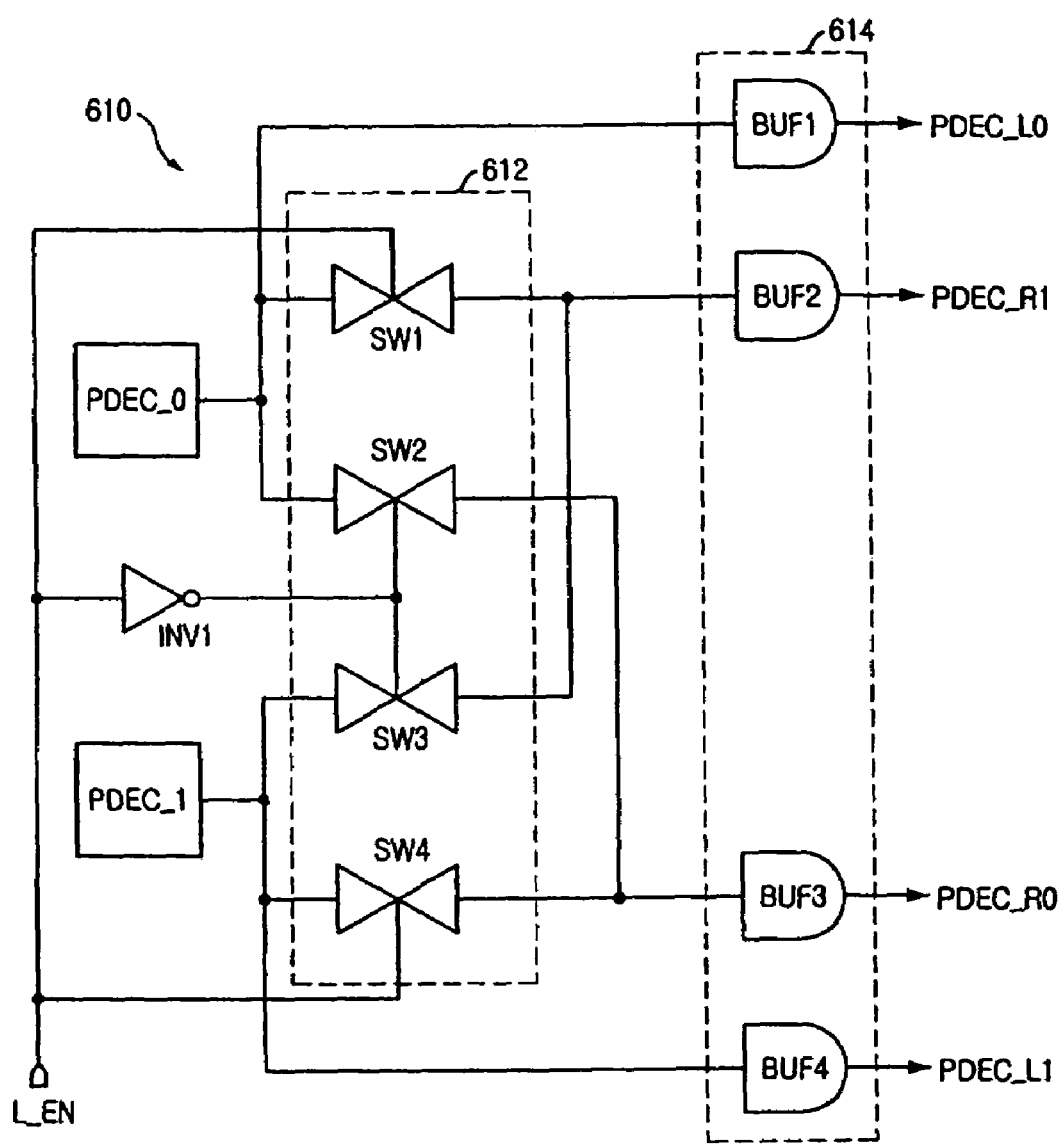
FIG. 8 is a block diagram of an address path changing adjustor in FIG. 7.

FIG. 8 is a block diagram of the address path changing adjustor in FIG. 7.

Referring to FIG. 8, the address path changing adjustor 610 includes a switching part 612, which selectively transfers the row address predecoder input signals PDEC_0 and PDEC_1 in response to the control signal L_EN, and a buffering part 614 for buffering the row address predecoder input signals PDEC_0 and PDEC_1 and an output signal from the switching part 612 and for outputting the path-changed row address predecoder output signals PDEC_L0, PDEC_R1, PDEC_R0 and PDEC_L1.

The address path changing adjustor 610 includes: an inverter INV1 to invert the control signal L_EN; a first switching device SW1 to receive the row address predecoder input signal PDEC_0 in response to the control signal L_EN; a second switching device SW2 to receive the row address predecoder input signal PDEC_0 in response to the inverted control signal L_EN by the inverter INV1; a third switching device SW3 to receive the row address predecoder input signal PDEC_1 in response to the inverted control signal L_EN by the inverter INV1; a fourth switching device SW4 to receive the row address predecoder input signal PDEC_1 in response to the control signal L_EN; a first buffer BUF1 to output the row address predecoder output signal PDEC_L0 by buffering the row address predecoder input signal PDEC_0; a second buffer BUF2 to output the row address predecoder output signal PDEC_R1 by buffering an output signal from the first or third switching device SW1 or SW3; a third buffer BUF3 to output the row address predecoder output signal PDEC_R0 by buffering an output signal from the second or fourth switching device SW2 or SW4; and a fourth buffer BUF4 to output the row address predecoder output signal PDEC_L1 by buffering the row address predecoder input signal PDEC_1

The control signal L_EN is a signal which is activated (for example, to a high voltage level) when the first cell array block operates in FIG. 5. Accordingly, when the first cell array block operates (that is, when the control signal is activated in a high voltage level), the row address predecoder output signals PDEC_L0 and PDEC_L1 are produced by the row address predecoder input signals PDEC_0 and PDEC_1 without any change in the order thereof, the row address predecoder input signal PDEC_0 is outputted as the row address predecoder output signal PDEC_R1, and the row address predecoder input signal PDEC_1 is outputted as the row address predecoder output signal PDEC_R0.

Figure 9:
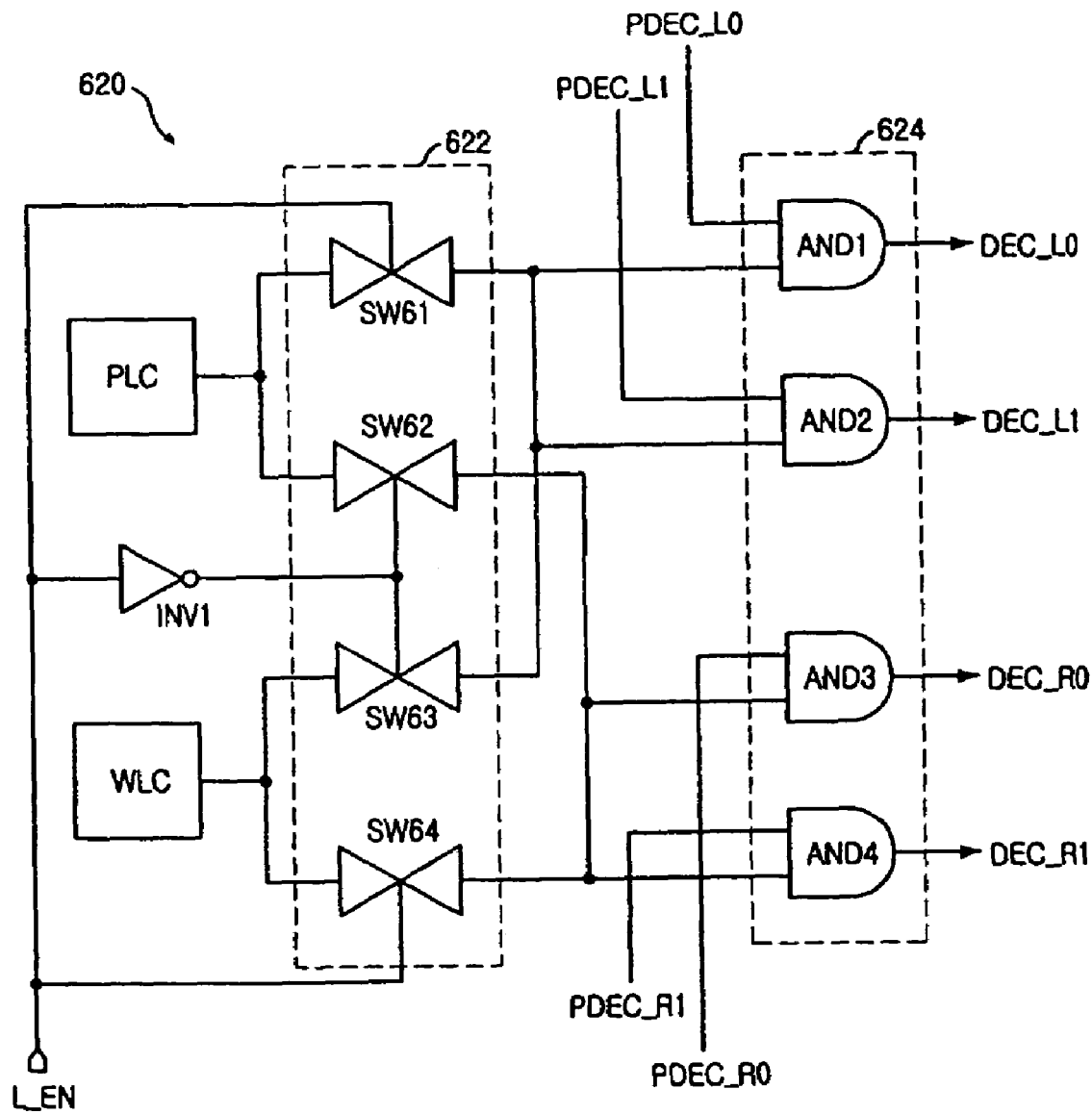
FIG. 9 is a circuit diagram of a WL/PL control signal path changing adjustor in FIG. 7.

FIG. 9 is a circuit diagram of the WL/PL control signal path changing adjustor in FIG. 7.

Referring to FIG. 9, the WL/PL control signal path changing adjustor 620 includes a switching part 622 to transfer the word line control signal WLC and the plate line control signal PLC in response to the control signal L_EN and an output part 624 to receive the row address predecoder output signal PDEC_L0, PDEC_R1, PDEC_R0 and PDEC_L1 and to output the SWL driving signal DEC_L0, DEC_L1, DEC_R0 and DEC_R1 in response to an output signal from the a switching part 622.

The WL/PL control signal path changing adjustor 620 includes: an inverter INV2 to invert the control signal L_EN; a switching device SW61 to receive the plate line control signal PLC in response to the control signal L_EN; a switching device SW62 to receive the plate line control signal PLC in response to the inverted control signal L_EN by the inverter INV2; a switching device SW63 to receive the word line control signal WLC in response to the inverted control signal L_EN by the inverter INV2; a switching device SW64 to receive the word line control signal WLC in response to the control signal L_EN; an AND gate AND1 receiving an output signal from the switching device SW61 or SW63 and the row address predecoder output signal PDEC_L0 and outputting the SWL driving signal DEC_L0; an AND gate AND2 receiving an output signal from the switching device SW61 or SW63 and the row address predecoder output signal PDEC_L1 and outputting the SWL driving signal DEC_L1; an AND gate AND3 receiving an output signal from the switching device SW62 or SW64 and the row address predecoder output signal PDEC_R0 and outputting the SWL driving signal DEC_R0; and an AND gate AND4 receiving an output signal from the switching device SW62 or SW64 and the row address predecoder output signal PDEC_R1 and outputting the SWL driving signal DEC_R1.

Since the control signal L_EN is activated (for example, to a high voltage level) when the first cell array block operates in FIG. 5, the SWL driving signals DEC_L0 and DEC_L1 are used as the plate line driving signals of the memory cells MC1_L and MC2_L and the SWL driving signals DEC_R0 and DEC_R1 are used as the word line driving signals of the memory cells MC1_L and MC2_L when the control signal L_EN is activated.

On the other hand, when the control signal L_EN is nonactivated (when the second cell array block operates), the SWL driving signals DEC_L0 and DEC_L1 are used as the word line driving signals of the memory cells MC1_R and MC2_R and the SWL driving signals DEC_R0 and DEC_R1 are used as the plate line driving signals of the memory cells MC1_L and MC2_L.

Figure 10:
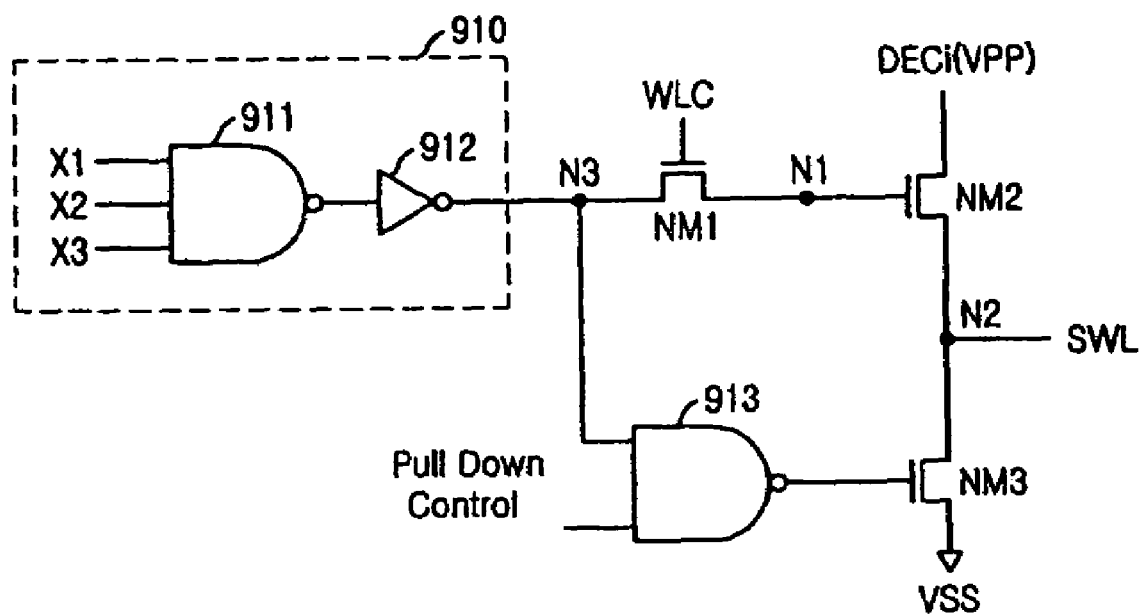
FIG. 10 is a circuit diagram of a SWL driver in FIG. 5.

FIG. 10 is a circuit diagram of the SWL driver in FIG. 5.

Referring to FIG. 10, the SWL driver (i.e., split word line booster) according to the present invention includes: an output node N2 connected to the split word line SWL; a decoding part 910 receiving a plurality of row address signal X1, X2 and X3 and activating the split word line; a pull-down NMOS transistor NM3 to drop a voltage level on the output node N2 to a ground voltage level VSS when the split word line SWL is nonactivated; a pull-down controller 913 (an NAND gate in this embodiment) receiving an output from the decoding part 910 and a pull-down control signal from an external circuit and controlling a switching operation of the pull-down NMOS transistor NM3; a pull-up NMOS transistor NM2 to transfer voltage levels (VPP) of the SWL driving signals DECi (DEC1, DEC2, DEC3 and DEC4) to the output node N2 in response to a voltage level on the node N1; and an NMOS transistor to selectively connect node N3 to node N1 in response to the word line control signal WLC. The decoding part 910 has a NAND gate 911 for NANDing the row address signal X1, X2 and X3 and an inverter 912 for inverting an output signal from the NAND gate 911.

Figure 11:
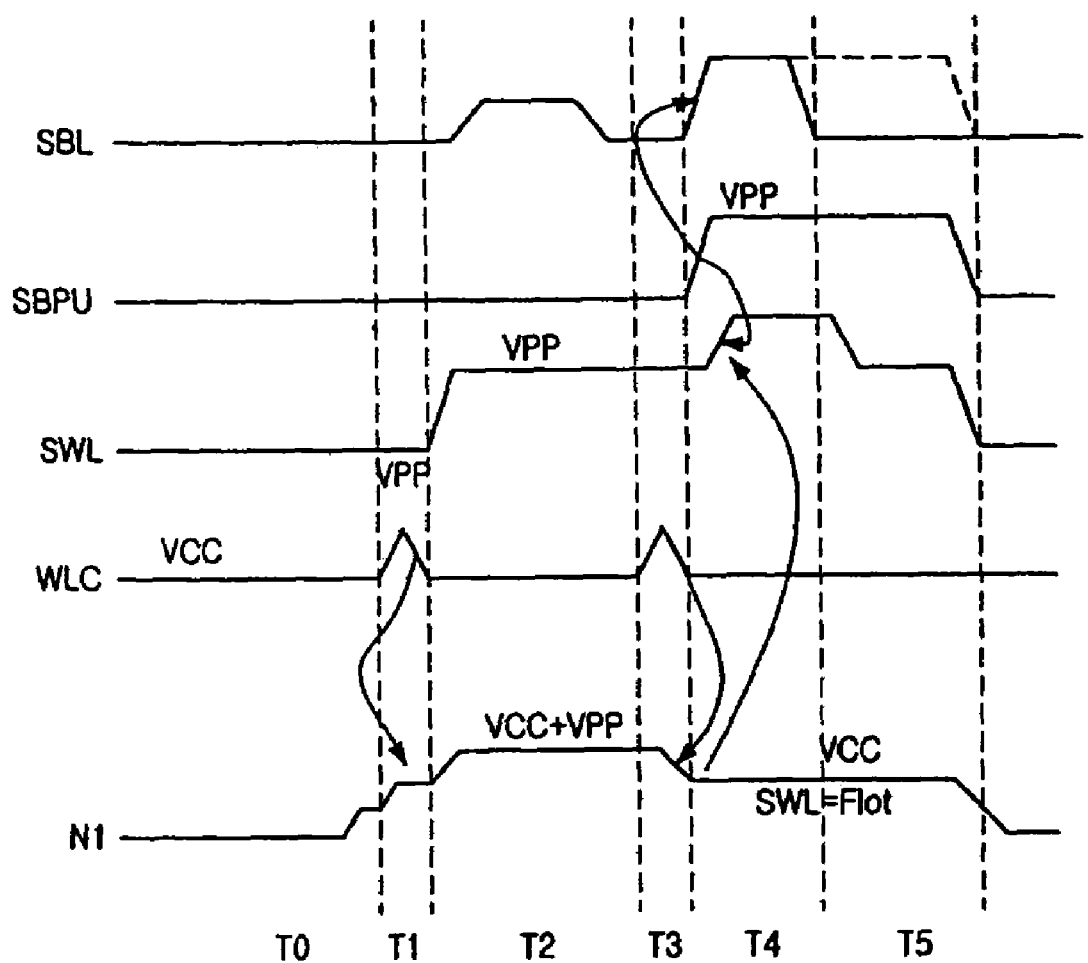
FIG. 11 is a timing chart illustrating the operation of the SWL driver in FIG. 10.

FIG. 11 is a timing chart illustrating the operation of the SWL driver in FIG. 10.

Referring to FIG. 11, if the split word line SWL is non activated, of a low voltage level of the pull-down control signal makes the NMOS transistor NM3 turned off so that the split word line SWL is in the ground voltage level VSS (period of time T0).

When the split word line SWL is activated, the pull-down control signal is in a high voltage level and an output signal from the inverter 912 is also in a high voltage level according to the row address signals X1, X2 and X3, thereby turning off the NMOS transistor NM3. Thereafter, the driving signal DEC is in a pumping volatge VPP just before the split word line is activated to the pumping volatge VPP and the word line control signal WLC is activated to the pumping voltage level VPP, thereby making the voltage on node N1 be in a high voltage level. Also, after a sufficient voltage level VCC is provided to node N1, the voltage of the word line control signal WLC decreases up to the voltage level VCC to prevent a voltage loss from being generated on node N1. That is, a self-boost operation is achieved (period of time T1).

When node N1 has in the sufficient voltage level VCC and the driving signal DEC goes from a low voltage level to the pumping voltage level VPP, the voltage level on node N1 goes from VCC to VCC+VPP so that the voltage of VCC+VPP is applied to the NMOS transistor NM2 without a voltage loss. Accordingly, there is no voltage loss in the VPP voltage level of the driving signal DEC and the VPP voltage level is transfer to the split word line SWL (period of time T2)

Meanwhile, if the word line control signal WLC is applied to the NMOS transistor in the VPP voltage level immediately before when a local bit line pull-up line SBPU is activated, the voltage level on node N1 drops up to the VCC voltage level (period of time T3).

As a result, the split word line SWL is in a floating state so that the self-boost is effectively achieved in the cell operation (period of time T4). In other words, the split word line SWL is pumped up again from the pumping voltage level VPP.

After the cell operation is made in the floating state of the split word line SWL, the split word line SWL goes to the precharge mode (period of time T4).

In FIG. 11, the local bit line SBL may be a bit line in a hierarchical bit line structure and the local bit line pull-up line SBPU may be a pull-up line in a hierarchical bit line structure. The above-mentioned method for driving the split word line SWL using the self-boost operation may contributes the operation voltage to be decreased.

Figure 12:
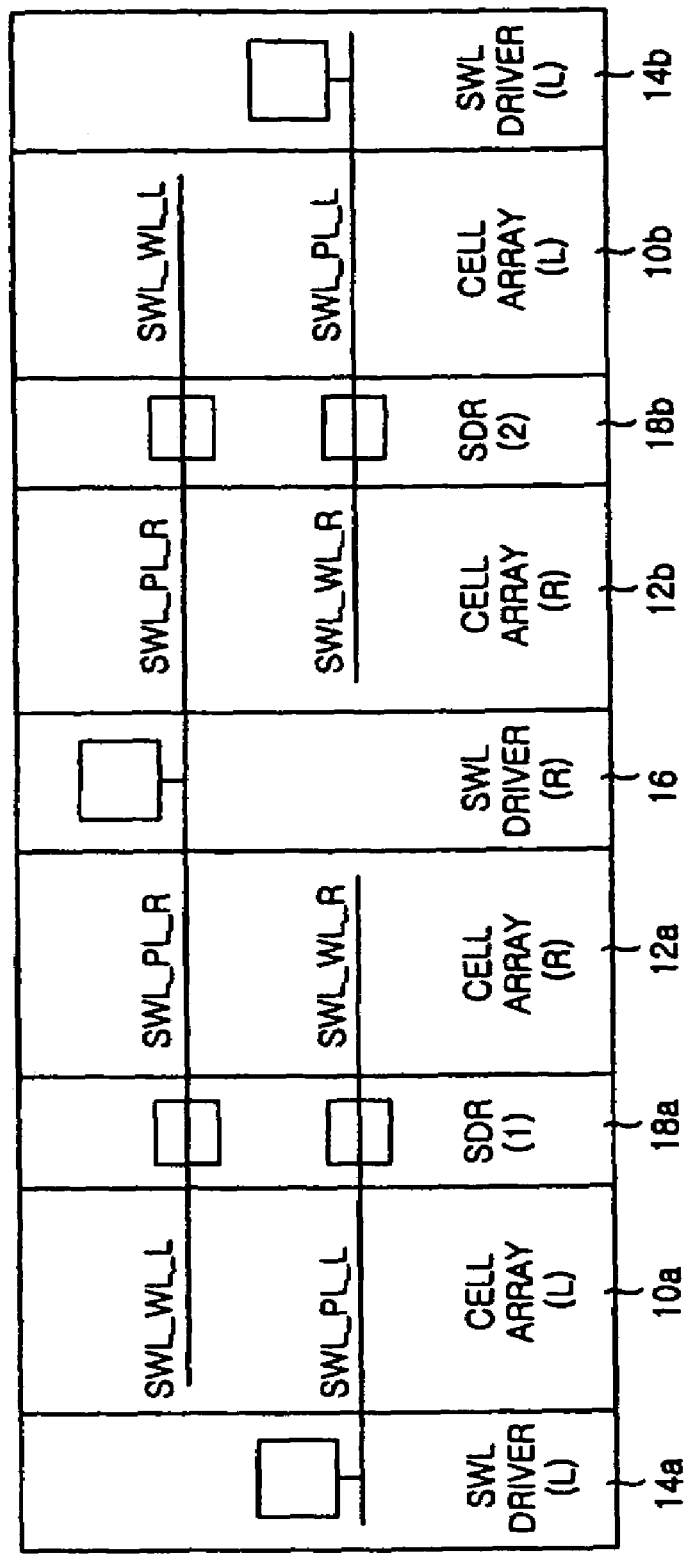
FIG. 12 is a schematic view illustrating a ferroelectric memory device according to another embodiment of the present invention.

FIG. 12 is a schematic block diagram illustrating a cell array structure of a nonvolatile ferroelectric memory device according to another embodiment the present invention.

Referring to FIG. 4, the cell array structure according to another embodiment the present invention includes four cell array blocks 10a, 12a, 10b and 12b, three split word line drivers 14a, 16 and 14b and two sub drivers SDR (18a and 18b) as a unit operation bock and the whole cell array structure according to the present invention includes a plurality of unit operation bocks.

In the unit operation bock, the cell array blocks are symmetrically disposed centering around the split word line driver 16. That is, the cell array blocks 10a and 12a are disposed on the left of the split word line driver 16 and the cell array blocks 10b and 12b are disposed on the right of the split word line driver 16. The split word line driver 14a is disposed on the outmost left of the split word line driver 16 and the split word line driver 14b is disposed on the outmost right of the split word line driver 16.

The sub driver 18a is disposed between the cell array blocks 10a and 12a and the sub driver 18b is disposed between the cell array blocks 12b and 10b. The sub drivers 18a and 18b are provided in order that a word line self-boost is effectively achieved at the time of cell operation without a load on a plate line, which will be illustrated below.

As stated in FIG. 4, two split word lines are connected to one memory cell, one of which is connected, as a word line, to a gate of a switching transistor in the cell, as a word line, and the other of which is connected to a plate of a capacitor in the cell as a plate line.

The split word line driver 16 drives the plate lines SW_PL_L of the ferroelectric capacitors in the most adjacent cell array blocks 12a and 12b on the left and right thereof and drives the word lines SWL_WL_L of switching transistors in the cells of the cell array blocks 10a and 10b.

The split word line driver 14a drives the plate lines SEL_PL_L of the capacitors in the cell array blocks 10a and the word lines SWL_WL_R of the switching transistors in the cell array block 12a. The split word line driver 14b drives the plate lines SWL_PL_L of the capacitors in the cell array blocks 10b and the word lines SWL_WL_R of the switching transistors in the cell array block 12b. Namely, all of the split word line drivers 14a and 14b drive the plate lines of the cell capacitor when they drive the most adjacent cell array blocks on the left and right thereof and drive the word lines of the switching transistors in the next adjacent cell array blocks.

In case that the cell array blocks 10a and 12a are respectively driven by the split word line drivers 14a and 16 in FIG. 12, the cell array block 12a does not operate while the cell array block 10a is operating and the cell array block 10a does not operate while the cell array block 12a is operating. As a result, the cell array blocks 10a and 12a independently operate at the different time.

Although another unit operation block is not shown in FIG. 12, it may be adjacent to the unit operation block on the left and right thereof and collaborates with the split word line drivers 14a and 14b on its left and right.

Figure 13:
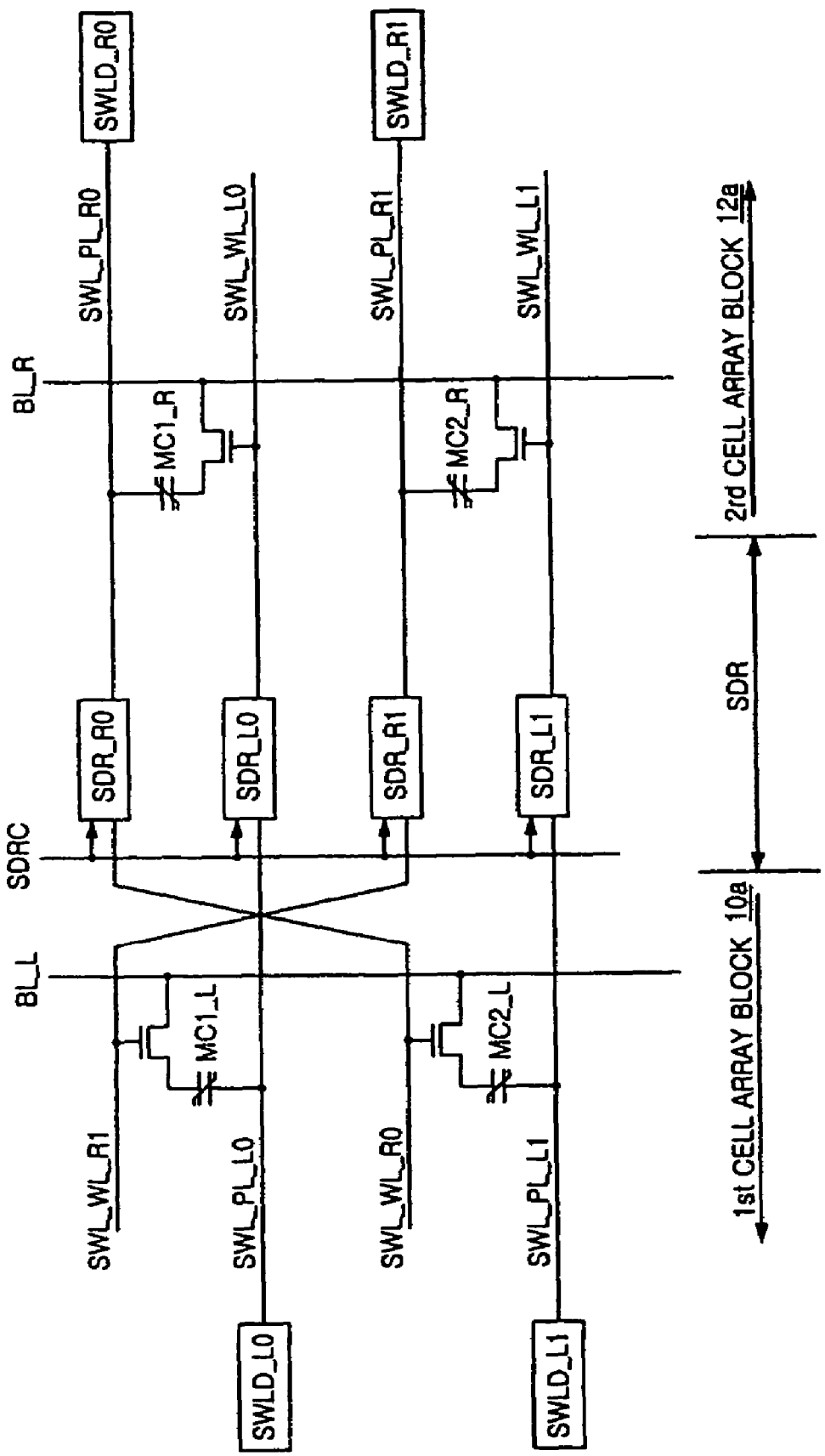
FIGS. 13 and 14 are schematic view illustrating a cell structure in the two cell array blocks to which a split word line and a sub driver SDR are connected.

FIG. 13 is schematic view illustrating the cell structure in the two cell array blocks to which the split word line and the sub driver SDR are connected.

Referring to the FIG. 13, although the cell array blocks 10a and 12a are respectively shown to have memory cells in one column in FIG. 4, they may have a plurality of columns. That is, the cell array blocks 10a and 12a have a plurality of bit lines BL_L and BL_R, respectively. Further, the cell array blocks 10a and 12a have a plurality of memory cells in a row and two memory cells connected to four split word lines operate as a unit structure and a plurality of unit structures make the FeRAM device of the present invention.

In the cell array block 10a, a split word line SWL_WL_R1 is used as a word line of a memory cell MC1_L corresponding to the first row; a split word line SWL_PL_L0 is used as a plate line of a memory cell MC1_L; a split word line SWL_WL_R0 is used as a word line of a memory cell MC2_L corresponding to the second row; and a split word line SWL_PL_L1 is used as a plate line of a memory cell MC2_L corresponding to the second row.

Similarly, in the cell array block 12a, the split word line SWL_WL_R1 is used as a plate line of a memory cell MC2_R corresponding to the second row; the split word line SWL_PL_L0 is used as a word line of a memory cell MC1_R corresponding to the first row; the split word line SWL_WL_R0 is used as a plate line of a memory cell MC1_R corresponding to the first row; and the split word line SWL_PL_L1 is used as a word line of a memory cell MC2_R corresponding to the second row.

Since the detailed structure of each of memory cell MC1_L, MC2_L, MC1_R and MC2_R in FIG. 13 is the same that in FIG. 5, the detailed description will be omitted. The first split word line SWL_WL_R1 and the third split word line SWL_WL_R0 cross each other on the boundary between the first and second cell array blocks and on the second split word line SWL_PL_L0.

In FIG. 4, a SWL driver SWLD_R1 is formed in the vicinity of the memory cell MC2_R in the cell array block 12b and drives the split word lines SWL_PL_R1 and SWL_WL_R1; a SWL driver SWLD_L0 is formed in the vicinity of the memory cell MC1_L in the cell array block 10a and drives the split word lines SWL_PL_L0 and SWL_WL_L0; a SWL driver SWLD_R0 is formed in the vicinity of the memory cell MC1_R in the cell array block 12a and drives the split word lines SWL_PL_R0 and SWL_WL_R0; and a SWL driver SWLD_L1 is formed in the vicinity of the memory cell MC2_L in the cell array block 10a and drives the split word lines SWL_PL_L1 and SWL_WL_L1.

Since the driving apparatus (having the SWL driver) for driving the split word line in this embodiment has the same features illustrated in FIGS. 6 to 8, the detailed description will be omitted On the other hand, compared to the first embodiment of the present invention (in FIG. 5), the split word lines, in this embodiment, further have sub driver (SDR) 18a. That is, the nonvolatile ferroelectric memory device includes: A sub driver SDR_R1 to make a switching connection between the split word line SWL_PL_R1 and the split word line SWL_WL_R1 which are driven by the SWL driver SWLD_R1; A sub driver SDR_L0 to make a switching connection between the split word line SWL_PL_R1 and the split word line SWL_WL_R1 which are driven by the SWL driver SWLD_L0; A sub driver SDR_R0 to make a switching connection between the split word line SWL_PL_R0 and the split word line SWL_WL_R0 which are driven by the SWL driver SWLD_R0; and A sub driver SDR_L1 to make a switching connection between the split word line SWL_PL_L1 and the split word line SWL_WL_L1 which are driven by the SWL driver SWLD_L1.

Figure 14:
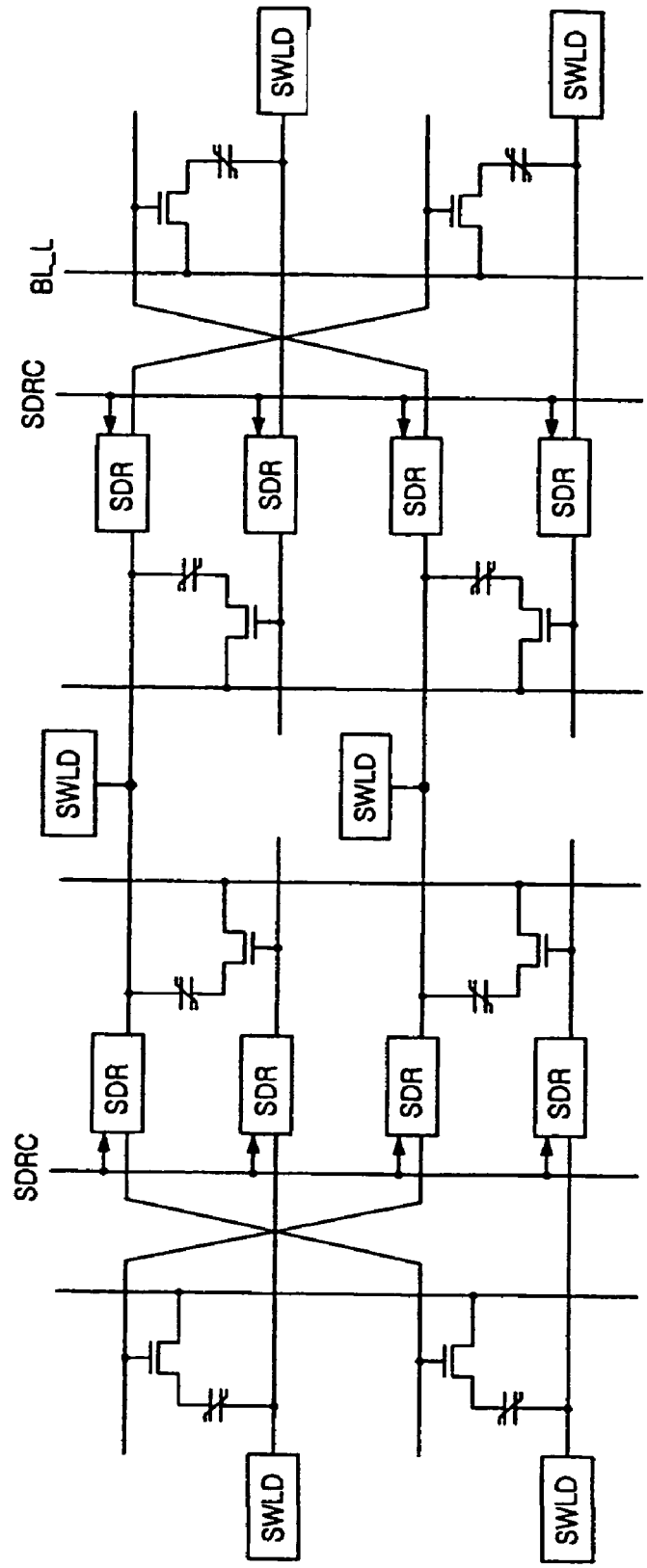

FIG. 14 is a block diagram illustrating a connection between four cell array blocks and the sub driver (SDR) connected thereto.

Figure 15:
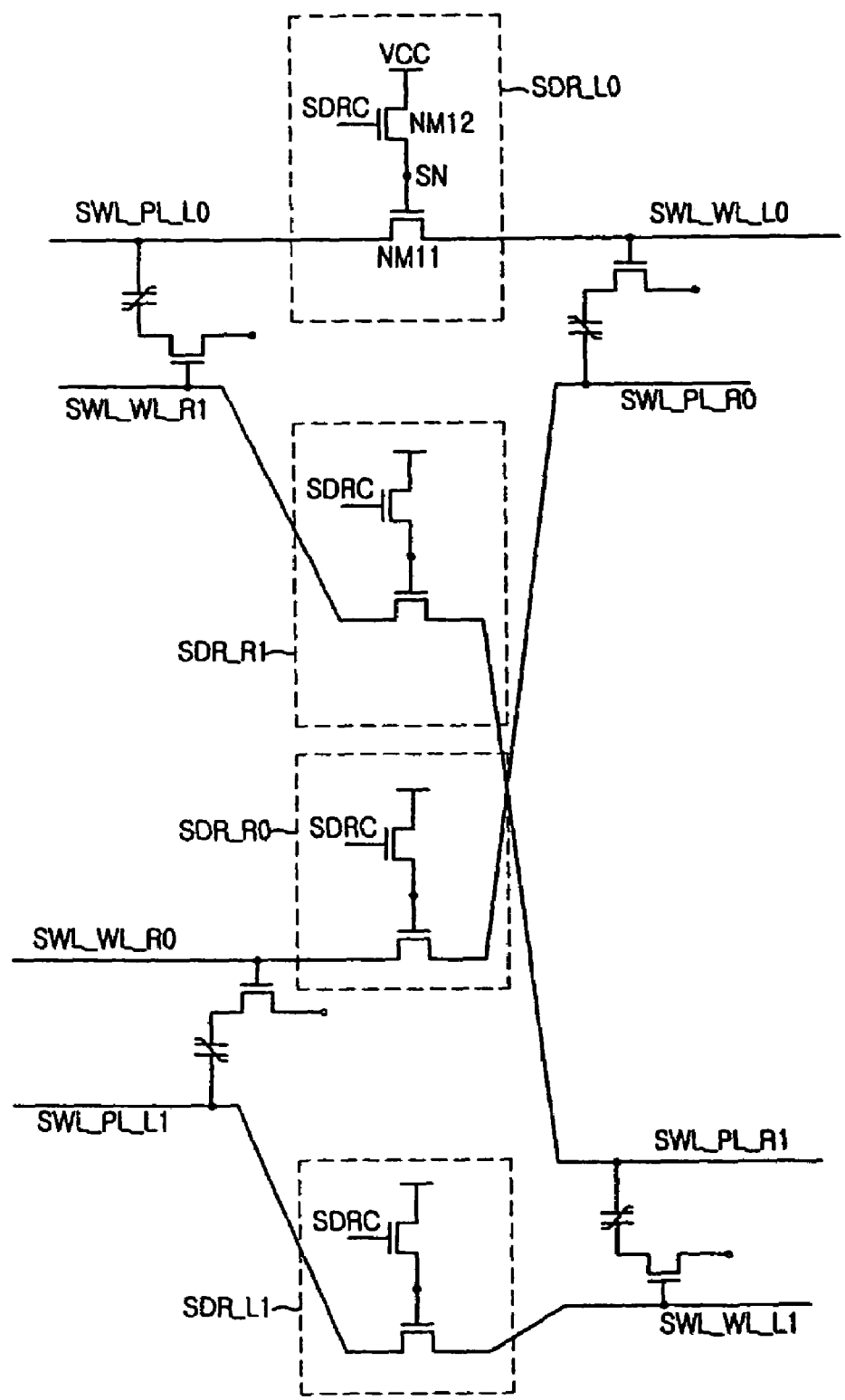
FIG. 15 is a detailed circuit diagram illustrating a sub driver (SDR) and the memory cells according to another embodiment of the present invention.

FIG. 15 is a detailed circuit diagram illustrating the sub driver (SDR) and the memory cells according to another embodiment of the present invention.

Referring to FIG. 15, each of the sub drivers SDR_L0, SDR_RO, SDR_R0 and SDR_L1 includes an NMOS transistor NM11, as a switching transistor, to selectively connect the split word lines within the cell array blocks 10a and 12a which are driven by the same SWL driver and further includes an NMOS transistor NM12, as a control transistor, to control a signal level on node SN of the gate of the NMOS transistor NM11 and to make the split word line floated in a high voltage level VCC at the time of cell operation. The NMOS transistor NM12, which is a control transistor of the sub driver, applies the voltage level VCC to none SN (the gate of the NMOS transistor NM11) in response to a control signal SDRC. The timing of the control signal SDRC will be described in detail below.

Figure 16:
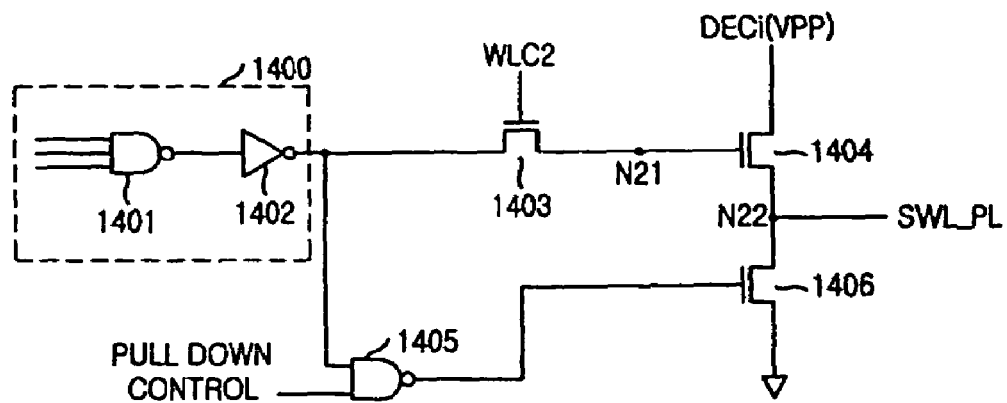
FIG. 16 is a circuit diagram of a SWL driver having the sub driver (SDR) according to another embodiment of the present invention.
Figure 17:
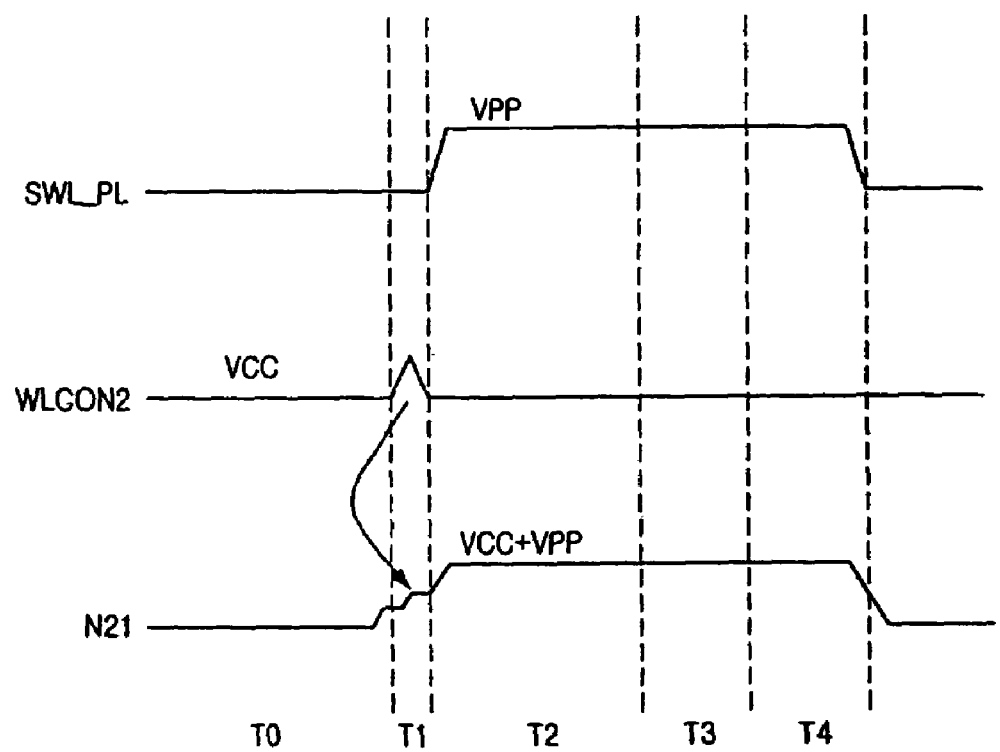
FIG. 17 is a timing chart of the SWL driver in FIG. 16.

FIG. 16 is a circuit diagram of the SWL driver having the sub driver (SDR) according to another embodiment of the present invention and FIG. 17 is a timing chart of the SWL driver in FIG. 16.

Referring to FIG. 16, the SWL driver (i.e., split word line booster) according to the present invention includes: an output node N22 connected to the split word line SWL_PL; a decoding part 1400 receiving a plurality of row address signal X1, X2 and X3 and activating the split word line; a pull-down NMOS transistor 1406 to drop a voltage level on the output node N22 to a ground voltage level VSS when the split word line SWL_PL is nonactivated; a pull-down controller 1405 (an NAND gate) receiving an output from the decoding part 1400 and a pull-down control signal from an external circuit and controlling a switching operation of the pull-down NMOS transistor 1406; a pull-up NMOS transistor 1404 to transfer voltage levels (VPP) of the SWL_PL driving signals DECi (DEC1, DEC2, DEC3 and DEC4) to the output node N22 in response to a voltage level on the node N21; and an NMOS transistor to selectively connect an output node of the decoding part 1400 to node N21 in response to the word line control signal WLC. The decoding part 910 has a NAND gate 911 for NANDing the row address signal X1, X2 and X3 and an inverter 1402 for inverting an output signal from the NAND gate 1401.

Referring to FIG. 17 illustrating the operation of the SWL driver according to another embodiment of the present invention, if the split word line SWL_PL is nonactivated, of a low voltage level of the pull-down control signal makes the NMOS transistor 1406 turned off so that the split word line SWL_PL is in the ground voltage level VSS (period of time T0).

When the split word line SWL_PL is activated, the pull-down control signal is in a high voltage level and an output signal from the inverter 1402 is also in a high voltage level according to the row address signals X1, X2 and X3, thereby turning off the NMOS transistor 1406. Also, the voltage of the word line control signal WLC2 decreases up to the voltage level VCC to prevent a voltage loss from being generated on node N21. That is, a self-boost operation is achieved (period of time T1).

When node N21 has in the sufficient voltage level VCC and the driving signal DEC goes from a low voltage level to the pumping voltage level VPP, the voltage level on node N21 goes from VCC to VCC+VPP so that the voltage of VCC+VPP is applied to the NMOS transistor 1404 without a voltage loss. Accordingly, there is no voltage loss in the VPP voltage level of the driving signal DEC and the VPP voltage level is transfer to the split word line SWL_PL (period of time T2)

The period of time T3 and T4 is a cell operation period to keep the high voltage level VCC+VPP on node 21 and, thereafter, a precharge mode is executed for the next operation.

Figure 18:
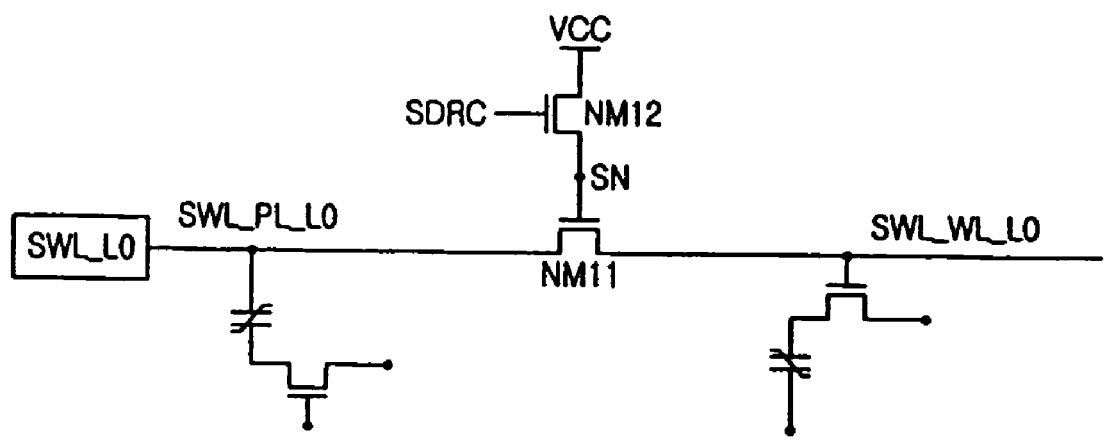
FIG. 18 is a circuit diagram illustrating a connection of the sub driver and the split word line in FIG. 15.
Figure 19:
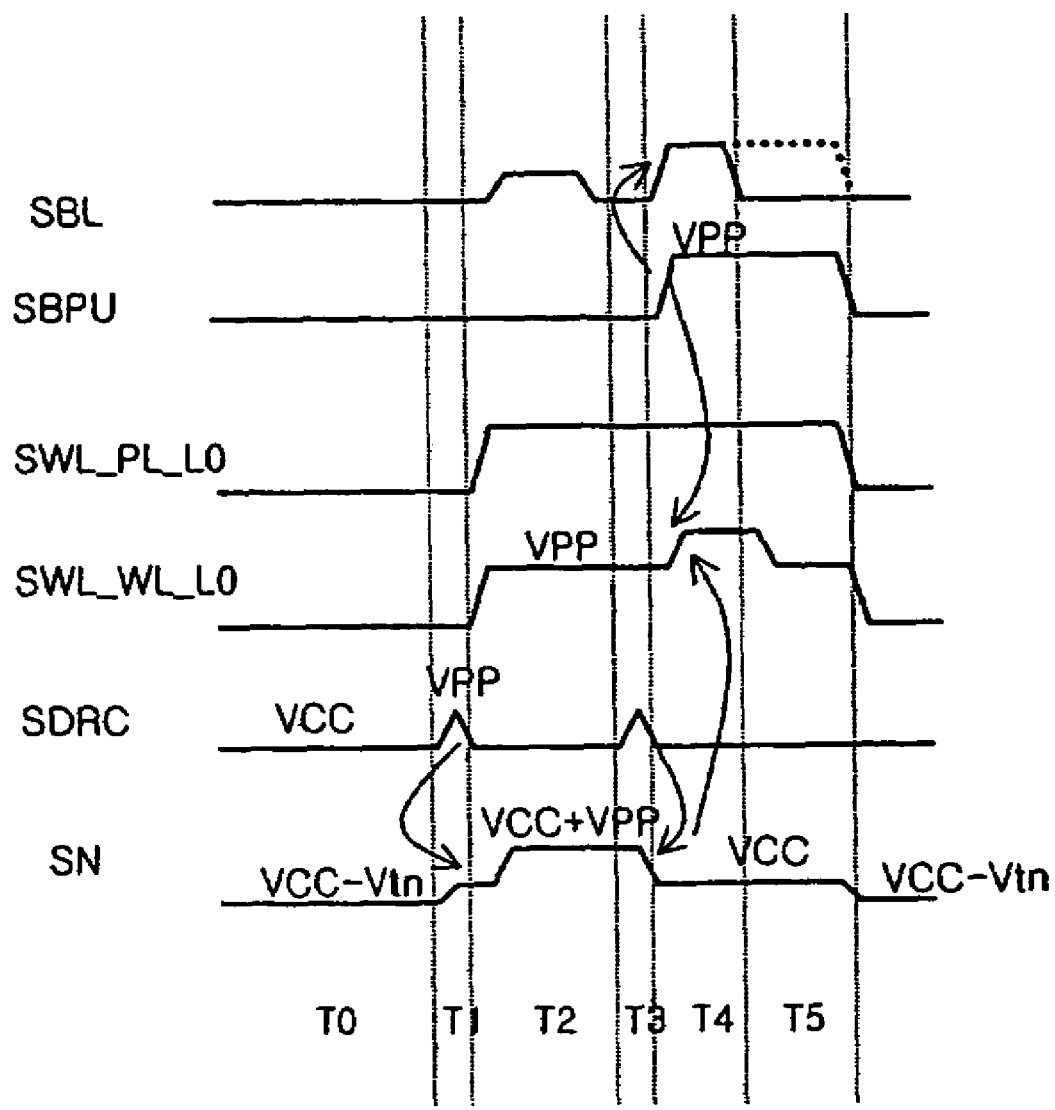
FIG. 19 is a timing chart illustrating an operation of the sub driver in FIG. 18.

FIG. 18 is a circuit diagram illustrating a connection of the sub driver and the split word line in FIG. 15 and FIG. 19 is a timing chart illustrating the operation of the sub driver in FIG. 18.

Referring FIGS. 18 and 19, at the period of time T0, the control signal SDRC is in a high voltage level VCC so that the voltage level on node SN is 'VCC-Vtn' (Vtn is a threshold voltage of the NMOS transistor NM12). The split word line SWL_PL_L0 and SWL_PL_L0 are nonactivated (logic 'low') by the SWL driver SWLD_L0.

At the period of time T1, a pumping voltage level VPP, as the control signal SDRC, is applied to the gate of the NMOS transistor NM12 and the voltage level on node SN goes VCC just before the split word lines SWL_PL_L0 and the SWL_PL_L0 are activated. Thereafter, the control signal SDRC goes from the VPP voltage level to VCC voltage level.

At the period of time T2, if the split word lines SWL_PL_L0 and the SWL_PL_L0 SWL are activated, node SN has a high voltage level VCC+VPP by a self-boost which is caused by the voltage drop (from VPP to VCC) of the control signal SDRC. Accordingly, the pumping voltage level VPP is transferred to the split word line SWL_WL_L0.

At the period of time T3, the control signal SDRC goes to the high pumping voltage level VPP just before the local bit line pull-up signal line SBPU is activated and node SN has a high voltage level VCC.

At the period of time T4, the split word line SWL_WL_L0 is in a floating state so that the self-boost is effectively achieved in the cell operation.

At the period of time T5, after the cell operation has been finished with the floating state of the split word line SWL_WL_L0, the precharge mode is executed for the next operation.

Figure 20:
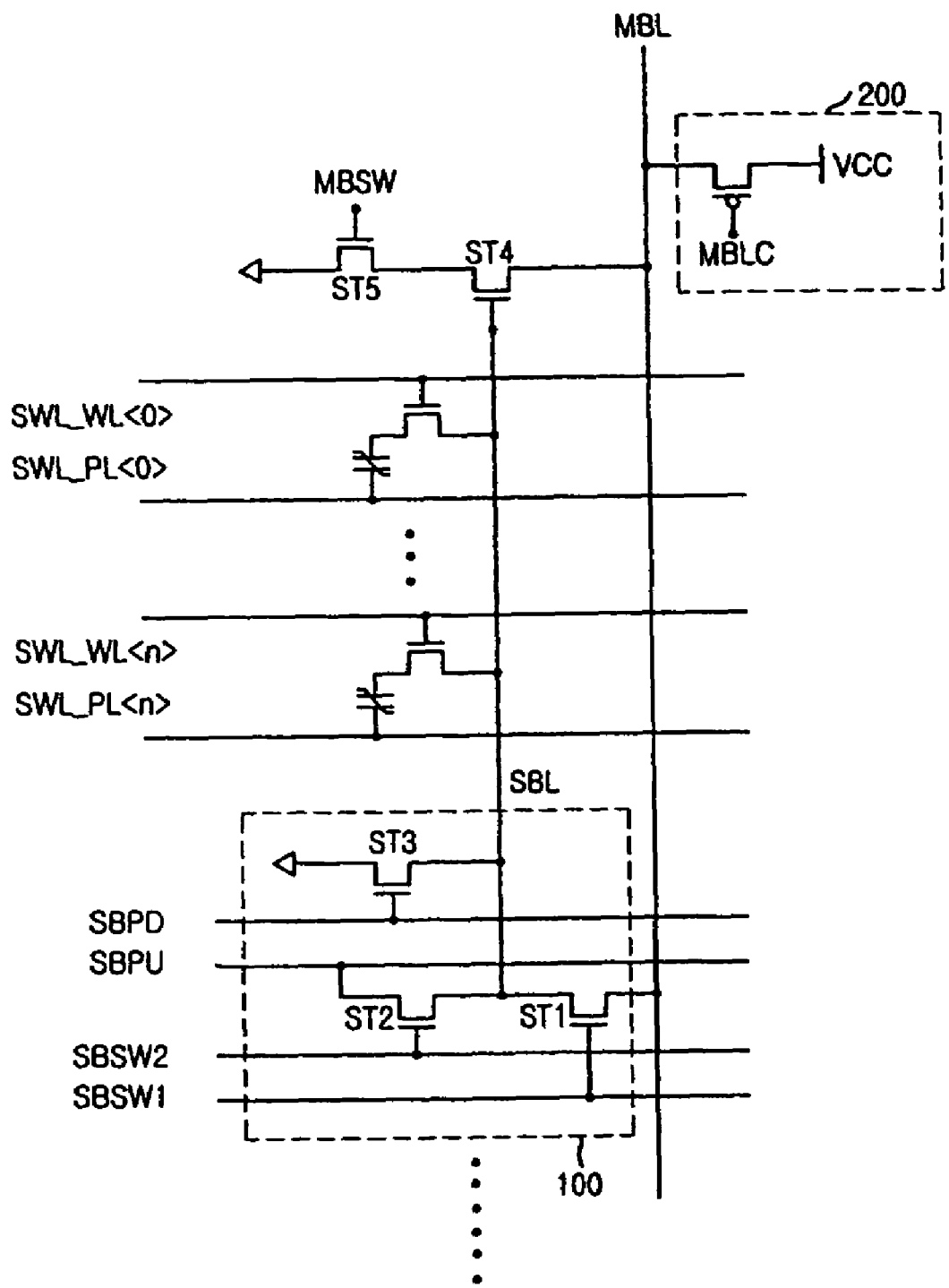
FIG. 20 is a circuit diagram of a cell array block having a hierarchical B/L.

FIG. 20 is a circuit diagram illustrating a cell array block having a hierarchical B/L and just one cell array block is shown in FIG. 20. Generally, the hierarchical B/L structure has a global bit line and a plurality of local bit lines and the plurality of local bit lines are selectively connected to the global bit line through a plurality of switching transistors.

Referring to FIG. 20, a global bit line MBL is formed in a direction of column and a local bit line SBL directly connected to a unit cell is arranged with the global bit line MBL in the same direction. A plurality of pairs of the split word lines SWL_WL<n> and SWL_PL<n> are provided, crossing the global bit line MBL (for sakes' convenience, just one local bit line SBL is shown in FIG. 20). Also, the local bit line pull-down signal line SBPD, the local bit line switching signal lines SBSW1 and SBSW2 and the local bit line pull-up signal line SBPU are provide in the same direction as the split word lines SWL_WL<n> and SWL_PL<n>.

A switching control block 100 selectively connects the global bit line MBL to one of the plurality of local bit lines SBL in response to control signals transferred via the signal lines SBPD, SBSW1, SBSW2 and SBPU and controls voltage level transferred from the ferroelectric capacitor. At least one load control part 200 is connected to the global bit line MBL in order to compensate for lack of sensing margin of a sense amplifier and includes a switching PMOS transistor to transfer the voltage level VCC to the global bit line MBL in response to a control signal MBLC.

On the other had, the switching control block 100 includes three switching transistors ST1, ST2 and ST3. The switching transistor ST1 selectively connects the global bit line MBL to the local bit line SBL in response to the signal line SBSW1 which is applied to a gate thereof, the switching transistor ST2 selectively connects the signal line SBPU to the local bit line SBL in response to the signal line SBSW2 which is applied to a gate thereof and the switching transistor ST3 selectively connects the local bit line SBL to a ground voltage level VSS in response to a voltage signal on the signal line SBPD which is applied to a gate thereof.

The sub cell array block includes switching transistors ST4 and ST5 selectively connect the global bit line MBL to the ground voltage level VSS in response to a control signal MBSW and a voltage signal on the local bit line SBL. The switching transistor ST4 has a gate connected to the local bit line SBL and carries out a switching operation between the global bit line MBL and the switching transistor ST5. Also, the switching transistor ST5 has a gate receiving the control signal MBSW and transfers the voltage level, which is transferred from the global bit line MBL via the switching transistor ST4, to the ground voltage level VSS in response to a control signal MBSW.

As a result, a voltage level corresponding to data stored in the call is transferred to the local bit line SBL in the sub cell array block and this voltage level is applied to the switching transistor ST4 (an NMOS transistor) via the local bit line SBL. Accordingly, current flowing at the switching transistor ST4 is dependent on an amount of the voltage level corresponding to data stored in the call and the switching transistor ST4 varies the voltage level of the global bit line MBL. The data sensing operation is carried out by comparing the varied voltage level on the global bit line MBL to a reference voltage at a sense amplifier. Further, the switching transistor ST5 functions as a device to prevent a leakage current at a write operation.

In similar to memory devices having the hierarchical bit line structure, the FeRAM according to the present invention also activates one of the plurality of local bit lines SBL at one operation time so that the load on the global bit line MBL may be decreased because relatively small number of cells are connected to the local bit line SBL.

Further, the voltage level on the local bit line SBL may be the ground voltage level when the signal line SBPD is activated in a high voltage level, there by carrying out the pull-down operation on the local bit line SBL and the signal line SBPU carries out the pull-up operation on the local bit line SBL to provide a pumping voltage higher than the high voltage level VCC to the local bit line SBL. The signal line SBSW2 controls a current flow between the signal line SBPU and the local bit line SBL.

Figure 21:
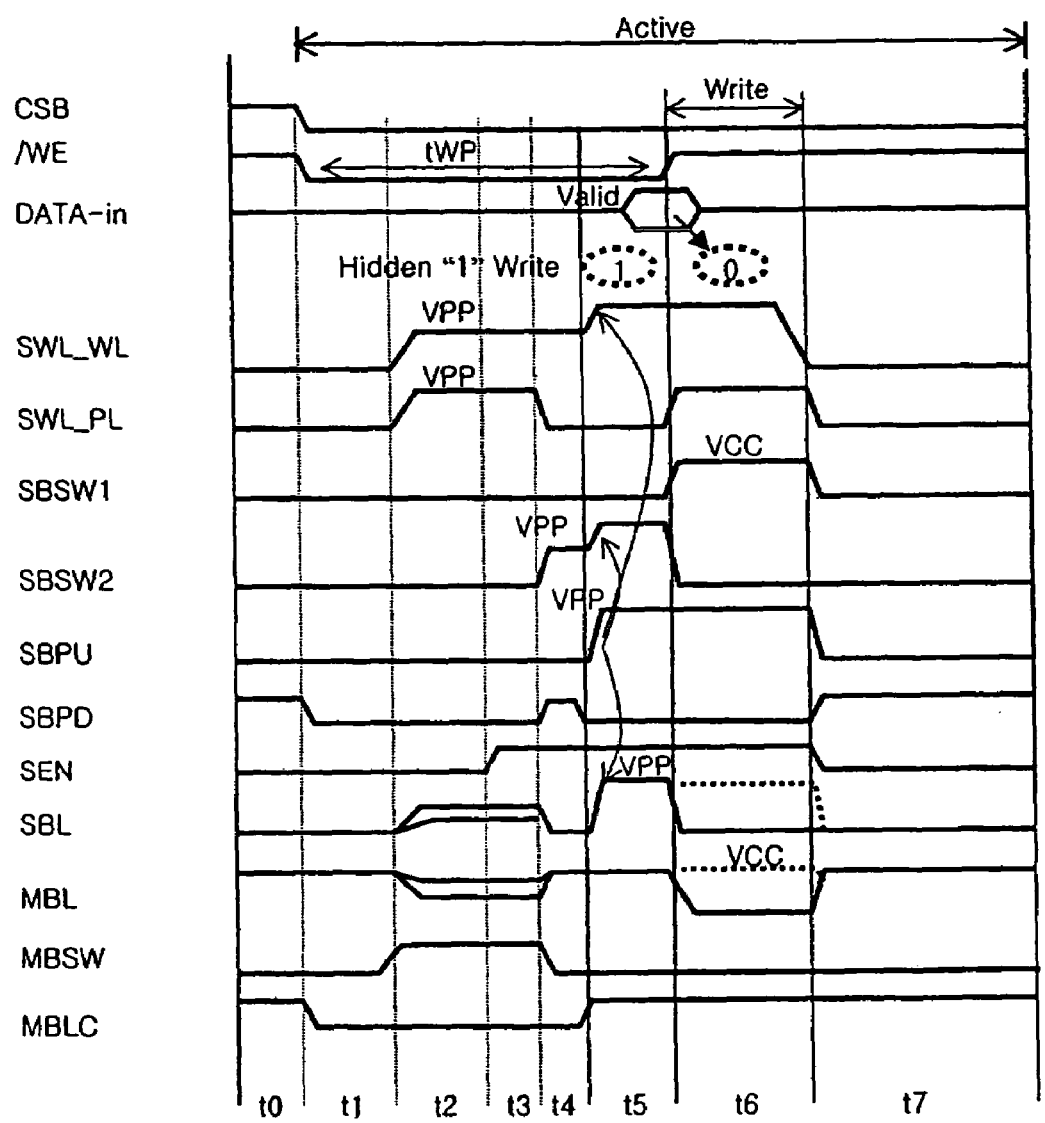
FIG. 21 is a timing chart illustrating the write operation of the nonvolatile ferroelectric memory device according to the present invention.
Figure 22:
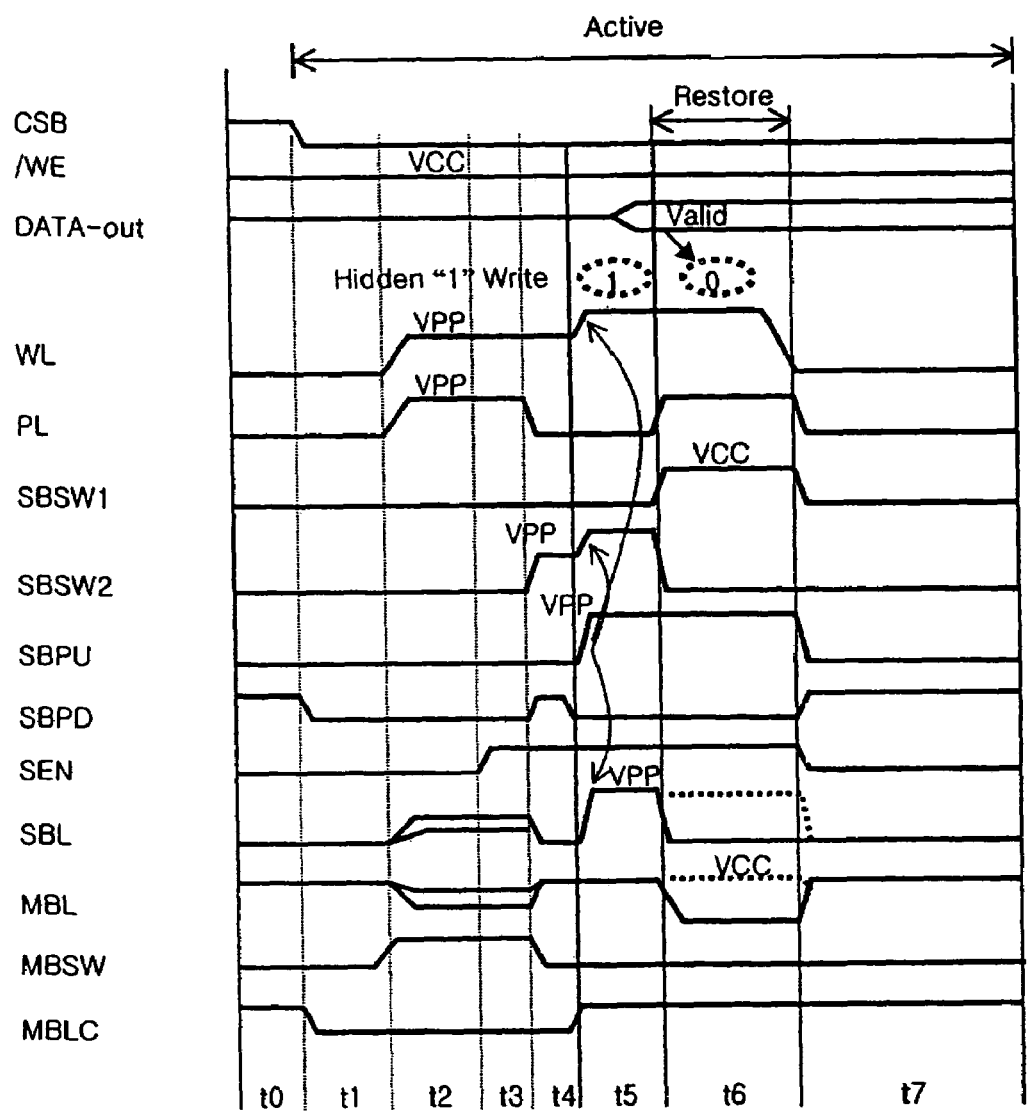
FIG. 22 is a timing chart illustrating read operation of the nonvolatile ferroelectric memory device according to the present invention.

Write and read operations of the nonvolatile ferroelectric memory device according to the present invention will be described in detail referring to FIGS. 21 and 22. FIG. 21 is a timing chart illustrating the write operation of the nonvolatile ferroelectric memory device according to the present invention and FIG. 22 is a timing chart illustrating read operation of the nonvolatile ferroelectric memory device according to the present invention.

The entire cell operation for one cycle may be divided into two sections, an active section and a precharge section. In FIGS. 21 and 22, the active section is made when a chip selection signal CSB is in a low level and the precharge section is made when the chip selection signal CSB is in a high level. Also, in FIGS. 21 and 22, t0 is a precharge section and t1 to t7 are continuous active section.

First, referring to FIG. 21, at the period of time T0, the high voltage level VCC is applied to local bit line pull-down signal line SBPD to precharge the local bit line SBL to the ground voltage level of VSS, thereby carrying the precharge operation. The global bit line MBL is precharged to the VCC voltage level by a high voltage level of the control signal MBLC. At this time, the split word line SWL_WL for the word line and the split word line SWL_PL for the plate line are nonactivated so that these lines are in a low voltage level of VSS and a low voltage level of VSS is applied to the local bit line switching signal lines SBSW1 and SBSW2, the local bit line pull-up signal line SBPU and the sense amplifier enable signal line SEN. The control signal MBSW is in a low voltage level of VSS.

At the period of time T1, the active section starts so that the chip selection signal CSB and the control signal MBLC are transited to a low voltage level and the signal line SBPD is in a low voltage level.

At the period of time T2, a high pumping voltage level VPP is applied to the split word line SWL_WL for the word line and the split word line SWL_PL for the plate line and the control signal MBSW is in a high voltage level VCC. Accordingly, the local bit line SBL is in a high voltage level, the switching transistor ST4 is turned on and then the global bit line MBL is in a low voltage level.

At the period of time T3, the voltage level VCC is applied to the sense amplifier enable signal line SEN for a data sensing operation. At the time sections of t2 and t3, the local bit line SBL, which is precharged to the voltage level VSS by the activations of the split word line SWL_WL for the word line and the split word line SWL_PL for the plate line, is developed by the chare sharing with the cell data in the ferroelectric memory and the switching transistor ST5 is turned on in response to the control signal MBSW so that the charges on the precharged global bit line MBL go to the ground voltage level VSS with an achievement of the developing procedure corresponding to the global bit line MBL. If the sufficient development of the local bit line SBL and the global bit line MBL is made at the period of time T2, the sense amplifier is enabled to sense the voltage difference between the global bit line MBL and a reference line at the period of time T2.

At the period of time T4, the pumping voltage level VPP is kept on the split word line SWL_WL for the word line and the split word line SWL_PL for the plate line goes from the pumping voltage level VPP to voltage of 0. The local bit line switching signal line SBSW2 goes from voltage of 0 to the pumping voltage level VPP and also the local bit line pull-down signal line SBPD goes from voltage of 0 to the pumping voltage level VPP. Voltage of 0 is continuously kept on the local bit line pull-up signal line SBPU. Accordingly, the local bit line SBL and the global bit line MBL are in a low voltage level and in a high voltage level VCC, respectively. At this time, the control signal MBSW goes to a low voltage level. The reason why the signal line SBSW2 has the pumping voltage level VPP at the period of time T4 is that the logic "1" should be written in the ferroelectric capacitors of all unit cells at the period of time T5 by making the word line and the signal line SBSW2 have a voltage level of 2VPP through the self-boost operation (Hidden "1" write).

At the period of time T5, the logic "1" is written in the ferroelectric capacitors of all unit cells. The signal line SBPU is in the high voltage level VPP, the local bit line pull-down signal line SBPD is in the high voltage level VSS. The local bit line SBL is in the high voltage level VPP and both the signal line SBSW2 and the split word line SWL_WL for the word line are in the high voltage level 2VPP by the self-boost operation. Accordingly, the voltage level of VPP on the local bit line SBL is transferred to a ferroelectric capacitor within a selected cell. Before the write operation is carried out at the period of time T6, the control signal MBLC is transited to a high voltage signal in order to turn off the load control part 200 at the period of time T5 (at the period of time T4, the control signal MBLC is a low voltage signal for the global bit line precharge)

At the period of time T6, a write operation of logic "0" is carried out. The split word line SWL_WL is in the voltage level 2VPP, the split word line SWL_PL is in the voltage level VPP, the signal line SBSW1 is in the voltage level VCC, the signal line SBSW2 is in a voltage level of 0V, the signal line SBPU maintains the voltage level VPP and the signal line SEN maintains the voltage level VCC. The signal line SBSW1 maintains the voltage level of 0V, except for the period of time T6. That is, the signal line SBSW1 is in the voltage level VCC only at the period of time T6 so that the switching transistor ST1 is turned on in order to connect the global bit line MBL to the local bit line SBL. Since the transistor in the selected unit cell is turned on, the voltage level VPP on the plate split word line SWL_PL is transferred to the gate of the switching transistor ST4 via the local bit line SBL and the switching transistor ST4 is turned on. Therefore, the global bit line MBL goes to a low voltage level of 0V.

Also, since the switching transistor ST1 is turned on, the low voltage level on the global bit line is written in the selected unit cell via the local bit line SBL. The cell voltage is applied to the local bit line SBL, the allied voltage to the local bit line SBL turns on the switching transistor ST4 to make a voltage drop on the global bit line MBL and the local bit line connected to the voltage-dropped global bit line MBL eventually undergoes the voltage drop with the logic "0" write operation.

All of the operational features at the time section t6 are the same as those at the time section t0.

As stated above, the operating voltage level of the local bit line pull-up line SBPU is VPP higher than VCC so that low power consumption below 1, 0V can be achieved. Also, the write operation according to the present invention does not require an additional operation time to reinforce the high data after the sense amplifying operation so that it is possible to reduce the cell operation time and the cycle time. Further, by using a current sensing of the global bit line MBL, the present invention has an excellent sensing margin even if the capacitor load is large and there is a capacitance mismatch of the global bit line, itself.

The read operation of the nonvolatile ferroelectric memory device according to the present invention will be describe in detail referring to FIG. 22.

The read operation of the present invention is the same as the write operation, except that the write enable signal /WE is in a voltage level of VCC during the read operation and data are written in the cell.

First, in case where the cell data is "1," current of the switching transistor ST4 increases because the local bit line SBL has a high voltage due to the data sensing of "1." Accordingly, the voltage level on the global bit line MBL is less than that on the reference voltage line.

On the contrary, in case where the cell data is "0," current of the switching transistor ST4 decreases because the local bit line SBL has a low voltage due to the data sensing of "0." Accordingly, the voltage level on the global bit line MBL is higher than that on the reference voltage line. Namely, the signal line SBSW1 has the voltage level VCC at the period of time T6 and the voltage level of 0V is applied to the local bit line SBL and the global bit line MBL while the switching transistor ST1 is turned on, thereby achieving the restoring operation of "0."

Before the restoring operation, the global bit line load control signal MBLC is made in a low voltage level at the period of time T4 so that the global bit line MBL undergoes the pull-up operation.

As apparent from the above, the nonvolatile ferroelectric memory cell array and he driving apparatus according to the present invention has lots of effaces. First, since the split word line is shared as the word line and the plate line in the two or four cell array blocks and these are driven by one driver, the load on the plate line dramatically decrease. Second, since the split word line is shared as the word line and the plate line in the two or four cell array blocks and these are driven by one driver, the number of drivers and the split word lines is reduced with the implement of small chip size of the FeRAM device. Third, the self-boost efficiency increases due to the split word line driving scheme and further the split word line, which is boosted in the cell operation, is floated in the corresponding cell array block through the sub driver, the nonvolatile ferroelectric memory cell array according to the present invention can achieves the low power consumption.

The foregoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A nonvolatile ferroelectric memory device comprising:
   a global bit line;
   a plurality of local bit lines, each of which is connected to a unit cell in a memory block;
   a plurality of switching means for selectively connecting the global bit line to one of the plurality of local bit lines;
   a reference line connected to a reference cell;
   sensing means for reading out data by comparing a voltage difference between the global bit line and the reference line; and
   a pull-down means for reducing a voltage level on the global bit line in response to a voltage level on the local bit line.

2. The nonvolatile ferroelectric memory device recited as in claim 1, wherein the pull-down means includes a pull-down transistor having a gate connected to the local bit line.

* * * * *